(12) United States Patent
Hokazono et al.

(10) Patent No.: US 10,374,599 B2
(45) Date of Patent: Aug. 6, 2019

(54) DELAY-TIME CORRECTION CIRCUIT, SEMICONDUCTOR-DEVICE DRIVE CIRCUIT, AND SEMICONDUCTOR DEVICE

(71) Applicant: Mitsubishi Electric Corporation, Tokyo (JP)

(72) Inventors: Kazuya Hokazono, Tokyo (JP); Akihisa Yamamoto, Tokyo (JP); Dong Wang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 414 days.

(21) Appl. No.: 15/377,390

(22) Filed: Dec. 13, 2016

(65) Prior Publication Data
US 2017/0338812 A1    Nov. 23, 2017

(30) Foreign Application Priority Data
May 19, 2016   (JP) .................................. 2016-100102

(51) Int. Cl.
| | |
|---|---|
| *H03K 17/284* | (2006.01) |
| *H02H 3/247* | (2006.01) |
| *H03K 17/08* | (2006.01) |
| *H03K 17/18* | (2006.01) |
| *H03K 17/22* | (2006.01) |
| *H02M 1/08* | (2006.01) |
| *H02M 1/38* | (2007.01) |
| *H03K 17/16* | (2006.01) |

(52) U.S. Cl.
CPC .......... *H03K 17/284* (2013.01); *H02H 3/247* (2013.01); *H02M 1/08* (2013.01); *H02M 1/38* (2013.01); *H03K 17/08* (2013.01); *H03K 17/162* (2013.01); *H03K 17/18* (2013.01); *H03K 17/223* (2013.01)

(58) Field of Classification Search
CPC ........ H03K 17/284; H02H 3/247; H02M 1/38
See application file for complete search history.

(56) References Cited

U.S. PATENT DOCUMENTS

| | | | |
|---|---|---|---|
| 7,724,547 B1* | 5/2010 | Zheng ..................... | H02M 1/15 323/283 |
| 9,401,710 B2* | 7/2016 | Hwang ................ | H03K 17/302 |
| 2013/0088279 A1* | 4/2013 | Shimano .............. | H03K 17/163 327/401 |

FOREIGN PATENT DOCUMENTS

| | | |
|---|---|---|
| JP | 2005-295661 A | 10/2005 |
| JP | 2005-348429 A | 12/2005 |
| JP | 2015-033190 A | 2/2015 |

* cited by examiner

*Primary Examiner* — Scott Bauer
(74) *Attorney, Agent, or Firm* — Studebaker & Brackett PC

(57) ABSTRACT

A delay-time correction circuit delays an input signal for generating a pre-drive signal to a drive unit generating a drive signal. A transition-change sensor senses a transition change in one of a turn-on operation and turn-off operation. A correction-signal generator generates a correction signal in response to the transition change sensed by the transition-change sensor and to the input signal. A delay output unit generates an output signal corresponding to the pre-drive signal by delaying the input signal using the correction signal. The delay output unit delays the output signal that instructs the other of a turn-on operation and turn-off operation, from the input signal, in accordance with a length of a period for the transition change in the one of a turn-on operation and turn-off operation that is performed immediately before the other of a turn-on operation and turn-off operation.

16 Claims, 10 Drawing Sheets

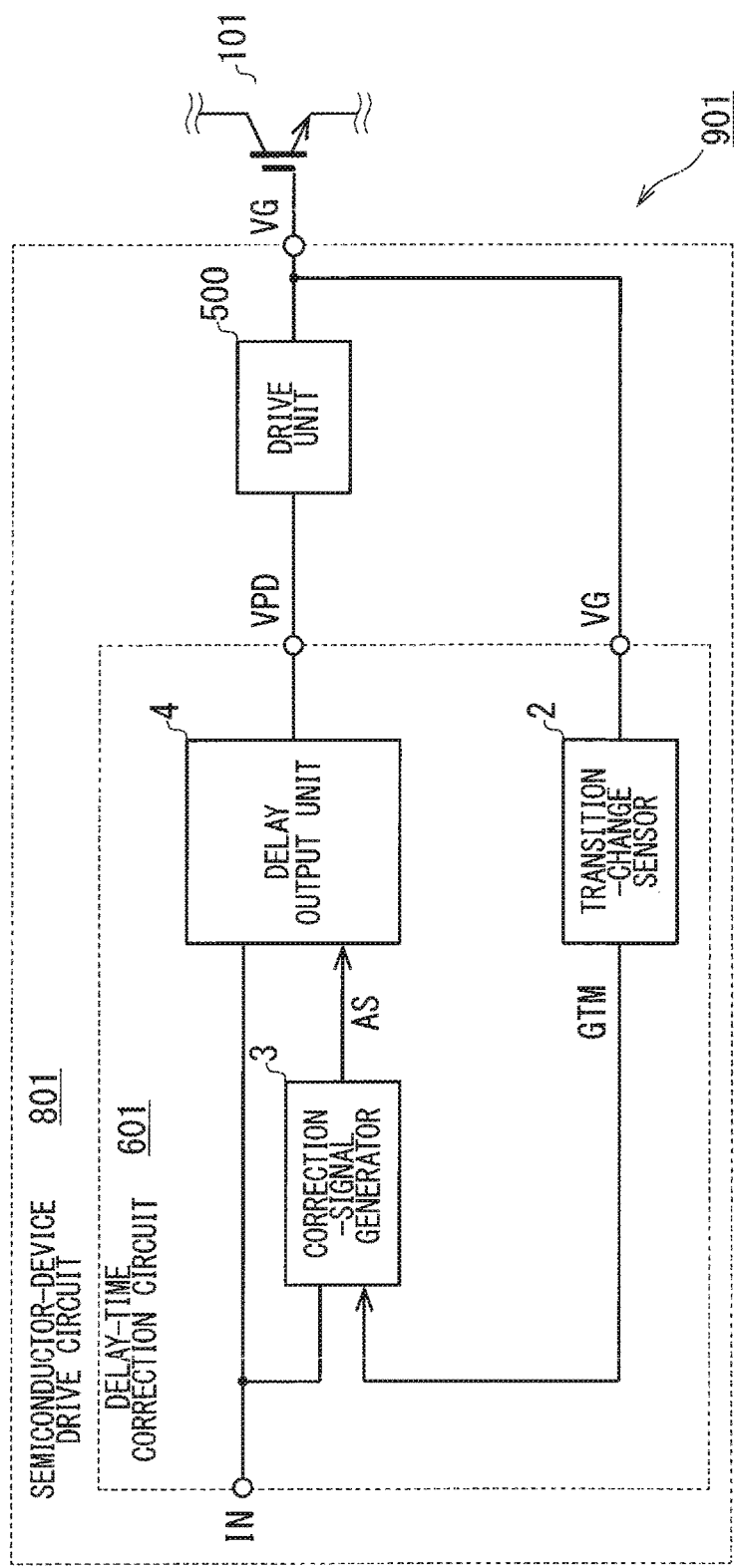
F I G. 1

F I G. 1 1
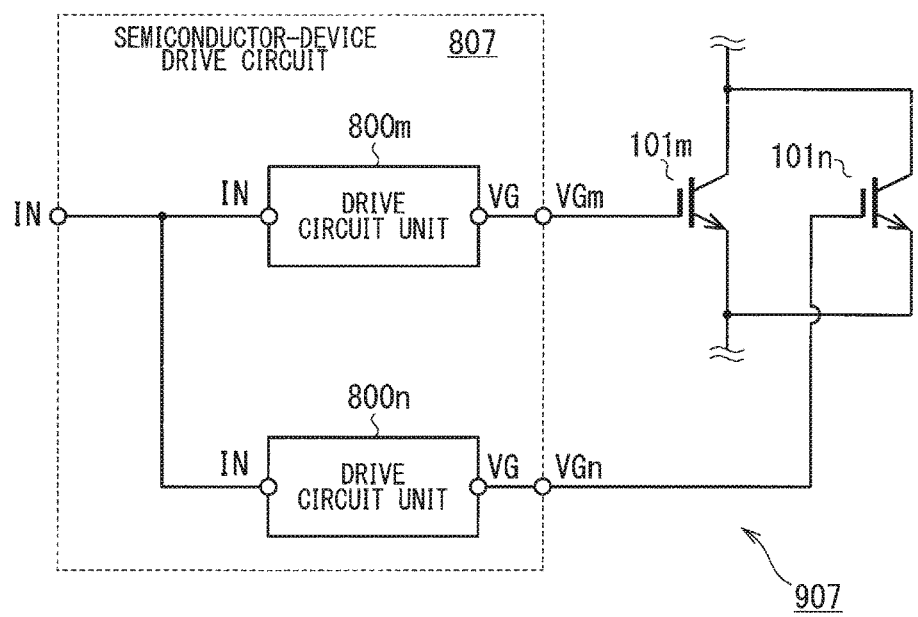

DELAY-TIME CORRECTION CIRCUIT, SEMICONDUCTOR-DEVICE DRIVE CIRCUIT, AND SEMICONDUCTOR DEVICE

BACKGROUND OF THE INVENTION

Field of the Invention

The present invention relates to delay-time correction circuits, semiconductor-device drive circuits, and semiconductor devices. Specifically, the present invention relates to a semiconductor device with a semiconductor switching element, a semiconductor-device drive circuit for the semiconductor device, and a delay-time correction circuit for the semiconductor-device drive circuit.

Description of the Background Art

Inverters, which generate outputs, such as sign waves in response to signals that are externally input, include semiconductor switching elements and drive circuits. The semiconductor switching element is driven by a drive signal that is generated by the drive circuit. The drive signal is typically a gate signal that controls a gate voltage of, for example, an insulated gate bipolar transistor (IGBT) or a metal oxide semiconductor filed effect transistor (MOSFET). The drive signal is also a pulse signal generated in synchronization with a signal that is input to the drive circuit (hereinafter referred to as a "pre-drive signal"). In a simple configuration, an input signal for the inverter can be used as a pre-drive signal without being processed.

In the inverter, a semiconductor switching element that is inappropriately turned on may result in an undesirable short-circuit. In this case, an overcurrent can flow through the semiconductor switching element. The following describes examples of a technique for avoiding such a problem.

Japanese Patent Application Laid-Open No. 2015-33190 discloses a switching controller that controls switching of a power conditioner circuit that includes a series of semiconductor modules each including a switching element and a diode that are connected in reverse parallel with each other. The switching controller includes a signal generation means and a detection means. The signal generation means generates a drive signal instructing turning-on and turning-off of each switching element. The drive signal includes a dead time during which the individual switching elements of the series are simultaneously turned off. This dead time prevents the upper and lower switching elements of the series from being simultaneously turned on. As a result, an undesirable short-circuit does not occur. The detection means detects a phase current flowing through the semiconductor modules. The signal generation means sets the dead time in accordance with a value of the phase current, which has been detected by the detection means. Accordingly, a dead time is set according to the state of the semiconductor module.

Reference is made to Japanese Patent Application Laid-Open No. 2005-348429. When a detection signal from a current detection means that detects a current flowing through a semiconductor switching element exceeds a prescribed trip level, the semiconductor switching element is caused to stop operating. A property correction means corrects fluctuations in the trip level due to variations in the current detection means. The property correction means includes a non-volatile memory. The non-volatile memory may be integrated with a drive circuit.

A large-capacity power conditioner can be made by connecting semiconductor switching elements in parallel with each other. In this case, a difference in characteristic of the semiconductor switching elements or of electronic components used in the drive circuits for the semiconductor switching elements may cause a timing lag in switching operations between the semiconductor switching elements. The following describes an example of a technique for avoiding such a situation.

Reference is made to Japanese Patent Application Laid-Open No. 2005-295661. A drive circuit includes a current sensing means, a drive-instruction generation means, a current-detection-period setting means, a timing-correction-necessity determination means, a latch means, and a delay-time determination means. The current sensing means detects a current flowing through a power semiconductor element. The drive-instruction generation means outputs a drive instruction to the power semiconductor element. The current-detection-period setting means outputs a current-detection-period setting signal in response to the signal from the drive-instruction generation means. The timing-correction-necessity determination means determines whether timing of a turn-off or turn-on operation is necessary in response to signals from the current sensing means, received at different timing in accordance with the current-detection-period setting signals. The latch means maintains an output of the timing-correction-necessity determination means. The delay-time determination means determines the amount of correction of timing of the turn-off or turn-on operation in response to the signal, which is maintained by the latch means.

Turn-on and turn-off operations in the semiconductor switching element are not momentary. Rather, these operations each involve a transitional phenomenon. In other words, these operations each involve a transitional period for a change from a turn-on state to a turn-off state or a change from the turn-off state to the turn-on state (hereinafter referred to as a "period for a transition change"). Commonly, a period for a transition change in the turn-on operation and a period for a transition change in the turn-off operation are not the same. Further, these periods for the transition changes can vary due to various factors. These factors include an internal factor such as variations in element characteristic, and an external factor such as environment. Theses variations can cause a difference between the width of an input signal for the inverter and the width of an output signal that is obtained from the semiconductor switching element, i.e., a difference between the width of the input signal for the inverter and the width of a final output signal of the inverter. The difference between the widths of the signals can cause a distortion of a waveform, particularly in an inverter that generates a sine wave.

The difference between the widths of the signals can be minimized by the above individual techniques. However, in the technique disclosed in Japanese Patent Application Laid-Open No. 2015-33190, the dead time is set in accordance with the detected phase current. This setting typically requires complicated control. The complicated control commonly requires a complicated configuration such as a microcomputer. Such a configuration is difficult to be integrated within the drive circuit. In contrast, the technique in Japanese Patent Application Laid-Open No. 2005-348429 or the technique in Japanese Patent Application Laid-Open No. 2005-295661 can use a relatively simple configuration. However, correction in these techniques is performed within a predetermined range or width. Hence, it is difficult to make an accurate, fine adjustment corresponding to the above difference between the widths of the signals.

SUMMARY OF THE INVENTION

The present invention is made to solve the above problem. It is an object of the present invention to provide a delay-time correction circuit, a semiconductor-device drive circuit, and a semiconductor device that are capable of, by using a relatively simple configuration, accurately correcting a deviation in the width of an output signal that is obtained from a semiconductor switching element, from the width of an input signal, where such a deviation is caused by variations in a period for a transition change of the semiconductor switching element.

The delay-time correction circuit according to an aspect of the present invention delays an input signal that is externally input for generating a pre-drive signal to a drive unit generating a drive signal for a semiconductor switching element. The delay-time correction circuit includes a transition-change sensor, a correction-signal generator, and a delay output unit. The transition-change sensor senses a transition change in one of a turn-on operation and turn-off operation of the semiconductor switching element. The correction-signal generator generates a correction signal in response to the transition change sensed by the transition-change sensor and to the input signal. The delay output unit generates an output signal corresponding to the pre-drive signal by delaying the input signal using the correction signal. The delay output unit delays the output signal that instructs the other of a turn-on operation and turn-off operation, from the input signal, in accordance with a length of a period for the transition change in the one of a turn-on operation and turn-off operation that is performed immediately before the other of a turn-on operation and turn-off operation.

According to the aspect of the present invention, when the semiconductor switching element repeating the turn-on and turn-off operations alternately is driven, in accordance with a variation in a period for a transition change in one of the turn-on and turn-off operations, a delay time during the immediately following operation, which is the other of the turn-on and turn-off operations, is corrected. Consequently, correction is made in accordance with the variation in the period for the transition change without the need for complicated analysis of the transition change and complicated adjustment in accordance with the result of the analysis. This enables the deviation in the width of the output signal of the semiconductor switching element from the width of the input signal, which is caused by the variation in the period for the transition change, to be accurately corrected with a relatively simple configuration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 a schematic block diagram of a configuration of a semiconductor device according to a first preferred embodiment of the present invention;

FIG. 11 is a schematic block diagram of a configuration of a semiconductor device according to a seventh preferred embodiment of the present invention.

DESCRIPTION OF THE PREFERRED EMBODIMENTS

Figure 2:
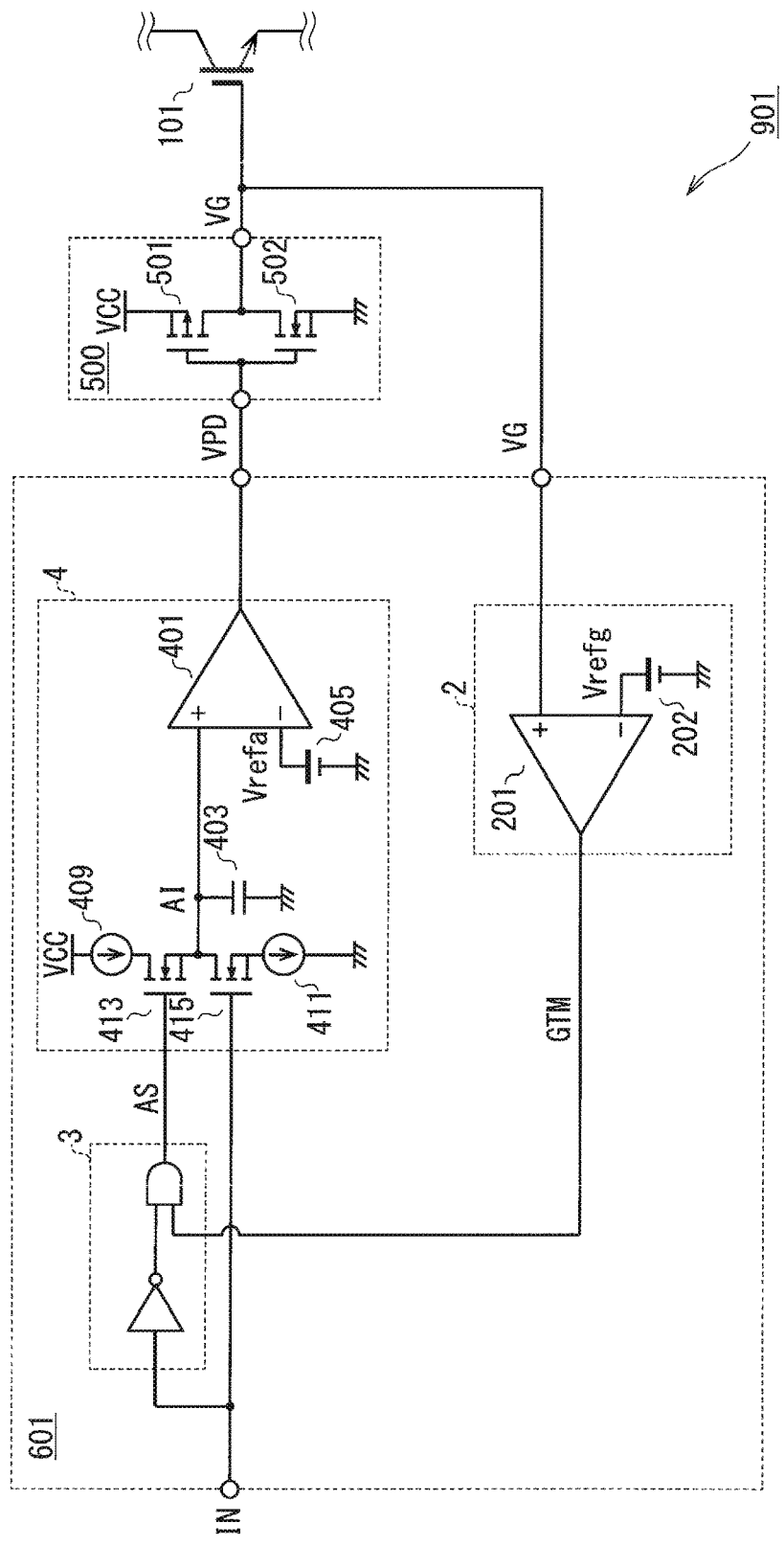
FIG. 2 is a circuit diagram illustrating a non-limiting example of how the semiconductor device in FIG. 1 is implemented.

The following describes preferred embodiments of the present invention referring to the drawings. In the drawings, the same components or corresponding components will be denoted by the same reference numerals. Description of these components will not be repeated.

First Preferred Embodiment (Summary)

FIG. 1 is a schematic block diagram of a configuration of an inverter 901 (semiconductor device) in a first preferred embodiment. The inverter 901 includes a semiconductor-device drive circuit 801 and an IGBT 101 (semiconductor switching element). The inverter 901 performs a switching operation using a drive signal that is generated in response to an external input signal, IN. The input signal IN is a digital signal corresponding to a turn-on state and turn-off state of the IGBT 101, and is a binary signal representing a high level or low level. The drive signal is specifically a gate signal, VG, (drive signal, gate voltage) that is applied to a gate of the IGBT 101.

The semiconductor-device drive circuit 801 includes a drive unit 500 and a delay-time correction circuit 601. The delay-time correction circuit 601 may be integrated within a single integrated circuit (IC) excluding a drive unit 500. Alternatively, the delay-time correction circuit 601 may be integrated within a single IC including the drive unit 500. Alternatively, the delay-time correction circuit 601 may be integrated within an IC including the drive unit 500 and IGBT 101. Delay-time correction circuits in the other preferred embodiments, details of which will be described later on, may be configured in the same manner.

The drive unit 500 generates the gate signal VG in response to a pre-drive signal, VPD. The pre-drive signal VPD is typically a digital signal. Specifically, the pre-drive signal VPD is a binary signal corresponding to the turn-on state and turn-off state of the IGBT 101. The gate signal VG and the pre-drive signal VPD start changing at the substantially same timing. In other words, the change in the gate signal VG starts synchronously with the change in the pre-drive signal VPD without any substantial phase differences. The gate signal VG, which is directly input to the IGBT 101, has a waveform under the influence of a transition change of the IGBT 101 after the gate signal VG starts changing.

The delay-time correction circuit 601 includes a transition-change sensor 2, a correction-signal generator 3, and a delay output unit 4. The delay-time correction circuit 601 also includes terminals from which the respective input signal IN and gate signal VG are received, and another terminal through which the pre-drive signal VPD for driving the drive unit 500 is output. The delay-time correction circuit 601 delays the external input signal IN to thus generate the pre-drive signal VPD for the drive unit 500. A to-be-given delay time is corrected in response to the input signal IN and the transition change of the IGBT 101. In the first preferred embodiment, a transition change to be considered for this correction is either in a turn-on operation or in a turn-off operation. When a transition change in the turn-on operation is considered, the start of the turn-off operation that is performed immediately after the turn-on operation is delayed in accordance with the length of a period for this transition change. When a transition change in the turn-off operation is considered, the start of the turn-on operation that is performed immediately after the turn-off operation is delayed in accordance with the length of a period of for this transition change.

The transition-change sensor 2 senses the transition change of the IGBT 101. Specifically, the transition-change sensor 2 senses a period from when the change in the pre-drive signal VPD is transmitted to the IGBT 101 as the change in the gate signal VG to when the transition change of the IGBT 101 completes a predetermined change; that is, the transition-change sensor 2 senses a period for the transition change. The transition-change sensor 2 generates a transition-change sensing signal GTM corresponding to the sensing result.

The periods for the transition changes typically correspond to a period until a current flowing through the IGBT 101 changes to a predetermined value. A period for the transition change in the turn-on operation, for instance, can be defined as a time from when a voltage between the gate of the IGBT 101 and an emitter of the IGBT 101 starts increasing until a collector current exceeds 10% of its maximum. A period for the transition change in the turn-off operation, for instance, can be defined as a time from when the voltage between the gate and emitter of the IGBT 101 starts decreasing until the collector current falls below 90% of its maximum. For instance, sensing a current flowing through the emitter can sense such changes in current. However, a method of sensing the periods for the transition changes does not necessarily have to be done through current sensing, or can be rather done through an indirect method by sensing a voltage changing along with a change in current. For example, a voltage between the collector and emitter of the IGBT 101 (more commonly, a voltage between main terminals) or a gate voltage VG is sensed. A method through sensing the gate voltage VG is relatively simple. The first preferred embodiment particularly details this method.

It is noted that a transition change to be sensed by the transition-change sensor 2 may belong to only one of the turn-on and turn-off operations of the IGBT 101.

The correction-signal generator 3 generates a correction signal AS in response to the input signal IN and the period for the transition change that is sensed by the transition-change sensor 2. Reference is made to an embodiment in which a delay in start of the turn-on operation is corrected. The correction-signal generator 3 generates the correction signal AS when the input signal IN corresponds to a turn-off instruction (i.e., when the input signal IN is at a low level) and when the transition-change sensing signal GTM corresponds to a turn-on state (i.e., when the transition-change sensing signal GTM is at a high level). The details of such an embodiment will follow referring to a time chart in FIG. 3. The turn-on state herein includes not only a steady turn-on state, but also a turn-on state in which a transition change is present as a result of the start of the turn-off operation. Thus, a period during which the correction signal AS is generated corresponds to the sum of a predetermined delay time and the period for the transition change in the turn-off operation starting along with the change in the pre-drive signal VPD, where such a predetermined delay time is a time from when the input signal IN changes from a high level to the low level until the input signal IN is transmitted to the change in the pre-drive signal VPD.

Reference is made to an embodiment in which a delay in start of the turn-off operation. The correction-signal generator 3 generates the correction signal AS when the input signal IN corresponds to a turn-on instruction (i.e., when the input signal IN is at the high level) and when the IGBT 101 is in the steady turn-off state or in the middle of the transition change in the turn-on operation. Thus, a period during which the correction signal AS is generated corresponds to the sum of a predetermined delay time and the period for the transition change in the turn-on operation starting along with the change in the pre-drive signal VPD, where such a predetermined delay time is a time from when the input signal IN changes from the low level to the high level until the input signal IN is transmitted to the change in the pre-drive signal VPD.

The delay output unit 4 corrects the delay time of the input single IN in accordance with a period during which the correction-signal generator 3 has generated the correction signal AS in an immediately preceding transition change. For this purpose, the delay output unit 4 is configured to temporarily store a time corresponding to the length of a period for the immediately preceding transition change. This storing does not necessarily require a complicated configuration such as a memory device. Rather, stored contents can be represented by, for instance, the amount of charge of a capacitance, the detail of which will be described later on. The input signal IN as delayed is output as the pre-drive signal VPD. In other words, the delay time of the input signal IN is a time until the change in the input signal IN is reflected to the change in the pre-drive signal VPD.

When a delay time during the turn-on operation is corrected, the aforementioned "immediately preceding transition change" is the transition change in the turn-off operation. In other words, a variation in the length of the period for the transition change in the immediately preceding turn-off operation is reflected to the length of a period during which the correction-signal generator 3 generates the correction signal AS. Hence, the delay time during the turn-on operation is corrected in accordance with the variation in the length of the period during which the correction signal AS has been generated, and the delay time during the turn-on operation is thus corrected in accordance with the length of the period for the transition change in the immediately preceding turn-off operation.

When a delay time during the turn-off operation is corrected, the aforementioned "immediately preceding transition change" is the transition change in the turn-on operation. In other words, a variation in the length of the period of transition change in the immediately preceding turn-on operation is reflected to the length of the period during which the correction-signal generator 3 has generated the correction signal AS. Hence, the delay time during the turn-off operation is corrected in accordance with the variation in the length of the period during which the correction signal AS has been generated, and the delay time during the turn-off operation is thus corrected in accordance with the length of the period for the transition change in the immediately preceding turn-on operation.

As described above, the delay output unit 4 delays the input signal IN using the correction signal AS, to thus generate the output signal corresponding to the pre-drive signal VPD. When a delay in the start of the turn-on operation is corrected, the delay output unit 4 delays the output signal instructing the turn-on operation, from the input signal IN in accordance with the length of the period for the transition change in the turn-off operation that is performed immediately before the turn-on operation. When a delay in the start of the turn-off operation is corrected, the delay output unit 4 delays the output single instructing the turn-off operation, from the input signal IN in accordance with the length of the period for the transition change in the turn-on operation that is performed immediately before the turn-off operation.

According to the first preferred embodiment, when the IGBT 101 repeating the turn-on and turn-off operations alternately is driven, in accordance with a variation in a period for a transition change in one of the turn-on and turn-off operations, a delay time during the immediately following operation, which is the other of the turn-on and turn-off operations, is corrected. Consequently, correction is made in accordance with the variation in the period for the transition change without the need for complicated analysis of the transition change and complicated adjustment in accordance with the result of the analysis. This enables a deviation in the width of the output signal of the IGBT 101 from the width of the input signal IN, which is caused by the variation in the period for the transition change, to be accurately corrected with a relatively simple configuration.

In particular, when only one of the turn-on and turn-off operations is considered in terms of the variation in the period for the transition change, a configuration of the delay-time correction circuit can be simple in comparison with a case where both operations are considered, the details of which will be described in a second preferred embodiment.

The transition-change sensor 2 senses the transition change of the IGBT 101 in response to the change in the gate voltage VG that is applied to the IGBT 101. Using the gate voltage VG, which is readily sensed, facilitates sensing the transition changes. It is noted that the transition-change sensor 2 may sense the transition change of the IGBT 101 in response to a change in a voltage between the main terminals of the IGBT 101, i.e., a change in a voltage between the collector and the emitter of the IGBT 101. This enables the transition-change sensor 2 to also serve as a circuit sensing a voltage between the terminals for another purpose, e.g., a desat sensing circuit. Alternatively, the transition-change sensor 2 may sense the transition change of the IGBT 101 in response to a change in a current between the main terminals of the IGBT 101. This enables the transition change of the IGBT 101 to be sensed more directly.

Although the first preferred embodiment uses the IGBT 101 as a semiconductor switching element, a different semiconductor switching element other than an IGBT may be used. Such a semiconductor switching element may be a metal insulator semiconductor field effector transistor (MISFET), such as a metal oxide semiconductor field effect transistor (MOSFET). The semiconductor switching element may include a silicon portion as a semiconductor region. The semiconductor switching element may include a portion made of a wide bandgap semiconductor. Wide bandgap semiconductors have bandgaps larger than a bandgap of silicon, and are made of, for instance, silicon carbide (SiC), gallium nitride (GaN), or diamond. Using the wide band gap semiconductor enables a semiconductor switching device to be switched quickly. The quick switching requires a strict reduction of a dead time. The first preferred embodiment addresses this requirement by correcting the delay times accurately.

(Example of Implementation)

FIG. 2 is a diagram illustrating a non-limiting example of how the circuit constituting the aforementioned inverter 901 is implemented. The present example corresponds to an embodiment in which a delay time during the turn-on operation is corrected in accordance with the transition change in the turn-off operation. In the present example, the transition changes are sensed in accordance with the change in the gate voltage VG. As such, the gate signal VG is input not only to the gate of the IGBT 101, but also to the delay-time correction circuit 601.

Reference is made to the drive unit 500. The drive unit 500 includes a p-channel metal oxide semiconductor (PMOS; i.e., p-channel MOSFET) 501 and an n-channel metal oxide semiconductor field effect transistor (NMOS; i.e., n-channel MOSFET) 502. A drain of the PMOS 501 and a drain of the NMOS 502 are connected to each other, to thus constitute a series structure of the PMOS 501 and NMOS 502. The PMOS 501 includes a source to which a power supply voltage VCC is applied, where the source is one end of this series structure. The NMOS 502 includes a source that is grounded, where the source is the other end of this series structure. The PMOS 501 and the NMOS 502 include respective gates to which the pre-drive signal VPD, which is generated by the delay-time correction circuit 601, is input. The gate signal VG is output to the IGBT 101 from between the PMOS 501 and the NMOS 502.

Reference is now made to the delay-time correction circuit 601.

The transition-change sensor 2 includes a comparator 201 and a constant voltage source 202. The constant voltage source 202 generates a predetermined voltage Vrefg. The transition-change sensing signal GTM, which is generated by the transition-change sensor 2, is a binary signal that is inverted when the gate voltage VG from the drive unit 500 exceeds the predetermined voltage Vrefg. The voltage Vrefg is a threshold used in referring to the gate voltage VG to determine the completion of the transition changes. In the present example, the completion of the transition change in the turn-off operation is recognized at a point when the gate voltage VG falls below the voltage Vrefg. This predetermined voltage Vrefg is preferably set to be equal to or less than a gate voltage during a Miller period of the IGBT 101, and is, for instance, set to be about the same as a threshold of the IGBT 101. The Miller period herein means a period during which the gate voltage is temporarily almost constant in the middle of a change in the gate voltage when the IGBT 101 undergoes switching. Such a period is also included in a waveform of the gate voltage VG illustrated in FIG. 3.

The correction-signal generator 3 include a NOT circuit and an AND circuit. The NOT circuit outputs an inverted signal of the input signal IN. The AND circuit receives the inverted signal of the input signal IN and the transition-change sensing signal GTM, to thus output the correction signal AS. Thus, the correction signal AS is at a high level when the input signal IN is at the low level and when the transition-change sensing signal GTM is at the high level, i.e., when the gate signal VG is equal to or greater than the predetermined voltage Vrefg. In other words, the correction AS is at the high level from when the input signal IN falls until the gate voltage of the IGBT 101 falls below the predetermined voltage Vrefg.

The delay output unit 4 includes a capacitance 403, a constant current source 409, a constant current source 411, an NMOS 413, and an NMOS 415. The constant current source 409 and the constant current source 411 each preferably generate an almost equal constant current. The capacitance 403 has one end that is grounded and the other end that includes a terminal voltage, AI. The capacitance 403 is charged by the constant current source 409 when the NMOS 413 is in the turn-on state, and is discharged by the constant current source 411 when the NMOS 415 is in the turn-on state. The terminal voltage AI is kept constant while both NMOS 413 and NMOS 415 are in the turn-off state. The NMOS 413 undergoes switching in response to the correction signal AS. The NMOS 415 is switched by the input signal IN.

The above configuration enables the capacitance 403 to be charged while the input signal IN is at the low level and while the correction signal AS is at the high level, i.e., from when the input signal IN changes to the low level until the gate signal VG falls below the predetermined voltage Vrefg. After the charge of the capacitance 403, the NMOS 413 is turned off when the IGBT 101 is steadily turned off. Accordingly, the charge is stopped, and the terminal voltage AI at this moment is held. Thus, the capacitance 403 is charged in accordance with the period for the transition change of the IGBT 101. Then, when the input signal IN changes to the high level, the NMOS 413 is turned off and the NMOS 415 is turned on. Consequently, the capacitance 403 is discharged. The terminal voltage AI becomes zero when electric charges are completely discharged. Then, the previously-mentioned charge starts again when the input signal IN changes to the low level.

The delay output unit 4 further includes a comparator 401 and a constant voltage source 405. The constant voltage source 405 generates a predetermined voltage Vrefa. The comparator 401 changes the pre-drive signal VPD to a high level when the terminal voltage AI of the capacitance 403 exceeds the voltage Vrefa. The comparator 401 also changes the pre-drive signal VPD to a low level when the terminal voltage AI of the capacitance 403 falls below the voltage Vrefa. This configuration enables the output single from the delay output unit 4 to be determined by comparing a value of the terminal voltage AI of the capacitance 403 and the predetermined voltage Vrefa (capacitance voltage threshold). This output signal changes to a low level when the terminal voltage AI of the capacitance 403 falls below the voltage Vrefa as a result of the discharge. That is, the pre-drive signal VPD changes to the low level. Consequently, the turn-on operation of the IGBT 101 starts.

As previously described, the period during which the capacitance 403 is charged is the period from when the input signal IN changes to the low level until the gate signal VG falls below the predetermined voltage Vrefg. In other words, this period is the period for the transition change in the turn-off operation. Accordingly, the amount of electric charges to be charged (the amount of charge) in the capacitance 403 is determined in accordance with the length of the period for the transition change in the turn-off operation. This amount of charge affects determination of a time until the terminal voltage AI of the capacitance 403 falls below the voltage Vrefa as a result of the discharge, i.e., a time until the pre-drive signal VPD changes to the low level. In other words, the start of the turn-on operation is delayed. Accordingly, a delay time of the turn-on operation is corrected in accordance with the length of the period for the transition change in the turn-off operation.

Figure 3:
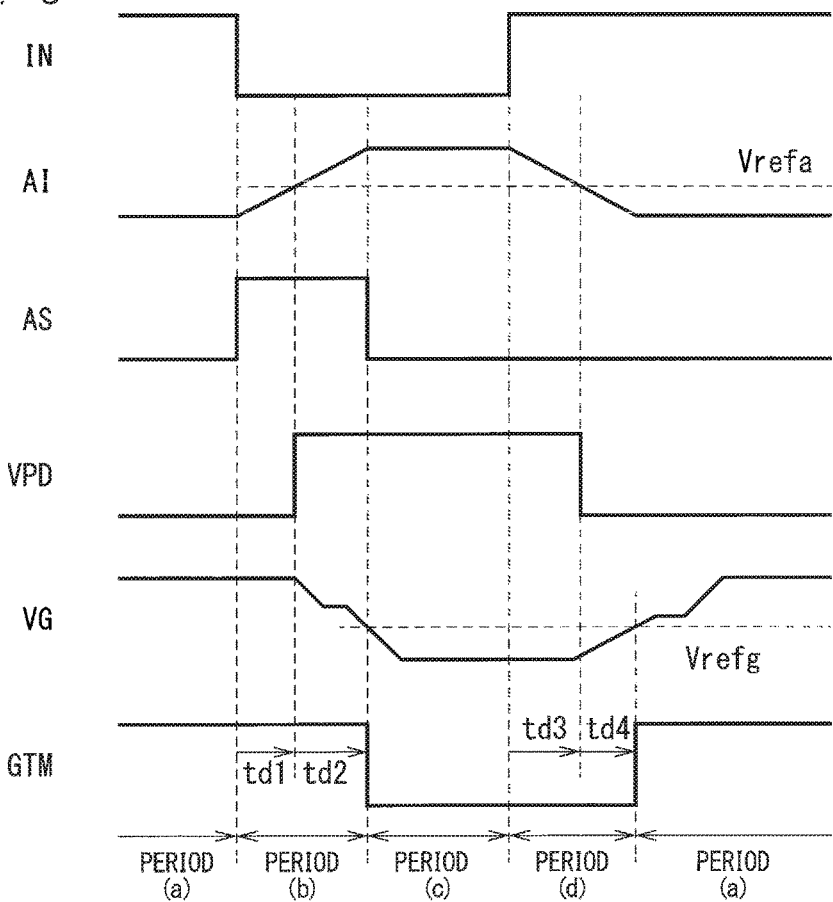
FIG. 3 is a time chart illustrating the operation of the semiconductor device in FIG. 2.

FIG. 3 is a time chart illustrating the operation of the inverter 901. Periods (a) through (d) are repeated sequentially while the inverter 901 operates.

The period (a) is a period during which the input signal IN is at the high level and the gate voltage VG is at a high level, i.e., a period during the steady turn-on state. Since the gate voltage VG is at the high level, the transition-change sensing signal GTM is also at the high level; the inverted signal of the input signal IN is, however, at a low level. Hence, the correction signal AS is at a low level, and thus the NMOS 413 is in the turn-off state. Further, since the input signal IN is at the high level, the NMOS 415 is in the turn-on state. Thus, the capacitance 403 has been discharged by the constant current source 411. Consequently, the terminal voltage AI of the capacitance 403 is at a low level.

The period (b) is a period from when the input signal IN falls until the gate voltage VG reaches the predetermined voltage Vrefg. When the input signal IN falls, the NMOS 415 is turned off in synchronization with this fall of the input signal IN. Further, the NMOS 413 is turned on when the correction signal AS changes to the high level. Accordingly, the capacitance 403 starts to be charged by the constant current source 409. Consequently, the terminal voltage AI of the capacitance 403 starts rising. The pre-drive signal VPD changes to the high level when the terminal voltage AI becomes higher than the predetermined voltage Vrefa. Consequently, the PMOS 501 is turned off and the NMOS 502 is turned on in the drive unit 500. As a result, the gate voltage VG starts falling. The former half of the period (b) is provided until this point. A time required for the former half is defined as a time td1. Then, when the gate voltage VG falls below the predetermined voltage Vrefg, the transition-change sensing signal GTM changes to a low level. Accordingly the correction signal AS changes to the low level. Thus, the NMOS 413 is turned off. Consequently, the charge of the capacitance 403 is stopped. Thus, the terminal voltage AI stops increasing. The latter half of the period (b) is provided until this point. A time required for the latter half is defined as a time td2. A charge time for the capacitance 403 is a total time of the time td1 and the time td2. Thus, the terminal voltage AI amounts to a value corresponding to this total time, and specifically amounts to a value that is proportional to the total time.

The period (c) is a period during which the input signal IN is at the low level and the gate voltage VG is at a low level, i.e., a period during a steady turn-off state Since both NMOS 413 and NMOS 415 are in the turn-off state, the terminal voltage AI is maintained at the value at the stop of the charge.

The period (d) is a period from when the input signal IN rises until the gate voltage VG exceeds the predetermined voltage Vrefg. The NMOS 415 is turned on in synchronization with this rise of the input signal IN. Accordingly, the capacitance 403 starts to be discharged by the constant current source 411. Consequently, the terminal voltage AI of the capacitance 403 starts falling. The pre-drive signal VPD changes to a low level when the terminal voltage AI becomes lower than the predetermined voltage Vrefa. The former half of the period (d) is provided until this point. A time required for the former half is defined as a time td3. The time td3 is a time from when the input signal IN changes from the low level to the high level until the pre-drive signal VPD changes correspondingly from the high level to the low level. Thus, the time td3 is a delay time of the pre-drive signal VPD with respect to the input signal IN during the turn-on operation. Here, the time td3, during which the terminal voltage AI falls down to the predetermined voltage Vrefa as a result of the discharge of the capacitance 403, is proportionate to the time td2, during which the terminal voltage AI increases further from the predetermined voltage Vrefa as a result of the charge of the capacitance 403. In particular, the time td3 is equal to the time td2 when a speed (unit: V/s) of the charge of the capacitance 403 is equal to a speed (unit: V/s) of the discharge of the capacitance 403.

The gate voltage VG starts rising when the pre-drive signal VPD falls. The transition-change sensing signal GTM changes to the high level when the gate voltage VG exceeds the predetermined voltage Vrefg. At this time, since the input signal IN is at the high level, i.e., the inverted signal of the input signal IN is at the low level, the change in the transition-change sensing signal GTM does not affect the correction signal AS. In other words, the correction signal AS is maintained at the low level. The latter half of the period (d) is provided until this point. A time required for the latter half is defined as a time td4.

A lapse of the period (d) again provides the state where the input single IN is at the high level and the gate voltage VG is at the high level, i.e., the steady turn-on state. In other words, the period (a) starts again. As such, the periods (a) through (d) are repeated.

According to the present example, the time td3 is specified in proportion to the time td2 as previously described. Here, the time td2 is the length of the period for the transition change in the turn-off operation of the IGBT 101. Further, the time td3 is a time until the instruction for the turn-on operation in response to the change in the input signal, from the low level to the high level is reflected to the pre-drive signal VPD. Thus, when the period for the transition change in the turn-off operation is unintentionally varies to be thus longer, a delay time in transmitting a signal for turning on the IGBT 101 is correspondingly made longer. In other words, the start of the subsequent turn-on operation is delayed in accordance with a delayed completion of the turn-off operation due to the variation in the period for the transition change. Conversely, when the period for the transition change in the turn-off operation is unintentionally varies to be thus shorter, the delay time in transmitting the signal for turning on the IGBT 101 is correspondingly shorter. In other words, the start of the subsequent turn-on operation moves ahead in accordance with an early completion of the turn-off operation due to the variations in the period for the transition change.

As described above, the delay time in the immediately following turn-on operation is corrected in accordance with the variations in the period for the transition change in the turn-off operation. Consequently, correction is made in accordance with the variations in the period for the transition change without the need for complicated analysis of the transition change and complicated adjustment in accordance with the result of the analysis. This enables the deviation in the width of the output signal of the IGBT 101 from the width of the input signal IN, which is caused by the variation in the period for the transition change, to be accurately corrected with a relatively simple configuration.

In particular, the equalization of the times td2 and td3 more accurately offsets an influence of a deviation in the time td2 upon the width of the output signal. Further, the predetermined voltages Vrefg and Vrefa, and a charge current value of the capacitance 403 can be set so that the time td1 is equal to the time td4. Such setting equalizes a delay during the turn-on operation to a delay during the turn-off operation.

(Modification)

The above example of implementation describes a configuration in which the delay time in the immediately following turn-on operation is corrected in accordance with the variation in the period for the transition change in the turn-off operation. Conversely, the delay time in the immediately following turn off operation may be corrected in accordance with the variation in the period for the transition change in the turn-on operation by using a similar method. Specifically, the time td1 may be specified in proportion to the time td4. In such a case, the voltage Vrefg is set so that the completion of the transition change in the turn-on operation can be recognized at a point when the gate voltage VG exceeds the voltage Vrefg. In particular, an equalization of the times td4 and td1 more accurately offsets an influence of a deviation in the time td4 upon the width of the output signal.

Second Preferred Embodiment (Summary)

Figure 4:
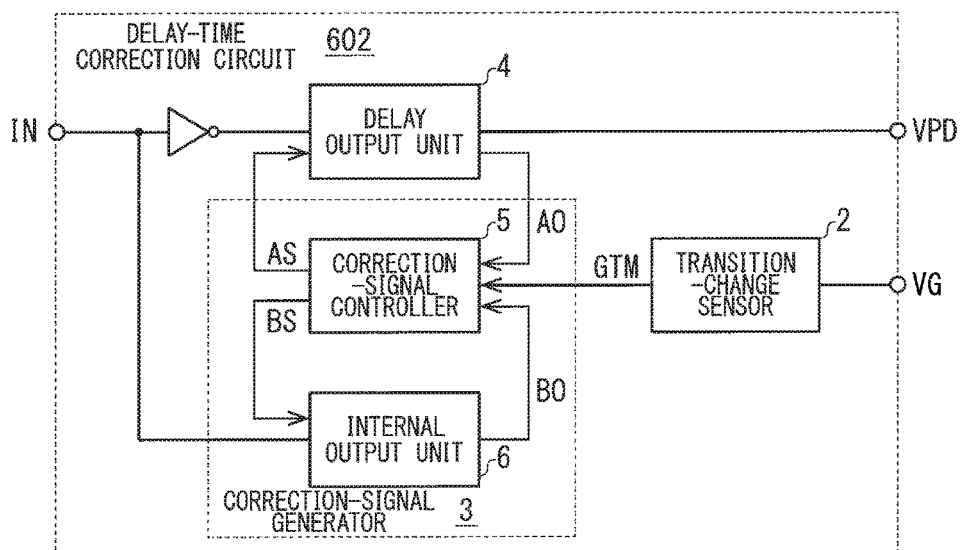
FIG. 4 is a schematic block diagram of a configuration of a delay-time correction circuit included in a semiconductor device according to a second preferred embodiment of the present invention.

FIG. 4 is a schematic block diagram of a configuration of a delay-time correction circuit 602 in a second preferred embodiment. The delay-time correction circuit 602 can be used in the semiconductor device 901 (FIG. 1) as the alternative to the delay-time correction circuit 601. Delay-time correction circuits in the other preferred embodiments, details of which will be described later on, can be used in the same manner.

The first preferred embodiment details a configuration in which the delay output unit 4 stores the time corresponding to the length of the period for the transition change in the immediately preceding turn-off operation. The second preferred embodiment details a configuration in which the delay output unit 4 stores a time corresponding to the length of the period for the transition change in the immediately preceding turn-on operation. To conform to this configuration, FIG. 4 illustrates a NOT circuit inserted between a terminal for the input signal IN and the delay output unit 4.

In the second preferred embodiment, the transition-change sensor 2 senses individual transition changes in the turn-on and turn off operations of the IGBT 101. Further, the delay output unit 4 generates a correction output signal AO. The correction output signal AO corresponds to the pre-drive signal VPD and may be substantially the same as the pre-drive signal VPD. In other words, the correction output signal AO may change at the same timing as the pre-drive signal VPD; for instance, the correction output signal AO may be a signal similar to the pre-drive signal VPD or an inverted signal of the pre-drive signal VPD. Referring to the correction output signal AO, i.e., the pre-drive signal VPD makes it possible to determine in which condition the IGBT 101 (FIG. 1) is, the condition where the IGBT 101 is in the period for the transition change during the turn-on operation or in the steady turn-on state, or the condition where the IGBT 101 (FIG. 1) is in the period for the transition change during the turn-off operation or in the steady turn-off state.

In the second preferred embodiment, the correction-signal generator 3 includes an internal output unit 6 and a correction-signal controller 5.

The internal output unit 6 is configured to temporally store a time corresponding to the length of the period for the transition change in the immediately preceding turn-off operation. The internal output unit 6 also generates a correction output signal BO. The correction output signal BO changes at a point when the aforementioned time as stored has lapsed after the change in the input signal IN instructing the start of the turn-on operation. Thus, referring to the correction output signal BO makes it possible to delay timing when the turn-on operation is actually started from a point when the input signal IN instructs the turn-on operation, in accordance with the period for the transition change in the immediately preceding turn-off operation.

The correction-signal controller 5 generates a correction signal BS in response to the correction output signal AO and transition-change sensing signal GTM. The correction signal BS is generated throughout a time corresponding to the period for the transition change in the turn-off operation. The correction signal BS may be generated in synchronization with the period for the transition change in the turn-off operation. The internal output unit 6 receives the correction signal BS to thus obtain information about a time corresponding to the length of the period for the transition change in the turn-off operation. The internal output unit 6 uses this information to thus correct a delay time during the turn-on operation.

The correction-signal controller 5 generates the correction signal AS in response to the correction output signal BO and the transition-change sensing signal GTM. The correction signal AS is generated throughout a time corresponding to the period for the transition change in the turn-on operation. The delay output unit 4 receives the correction signal AS to thus obtain information about a time corresponding to the length of the period for the transition change in the turn-on operation. The delay output unit 4 uses this information to thus correct a delay time during the turn-off operation. Referring to the aforementioned correction output signal BO specifies timing when the correction signal AS starts to be generated. The delay output unit 4 receives the correction signal AS to thus recognize timing when the time corresponding to the period for the transition change in the immediately preceding turn-off operation has lapsed after the input signal IN instructs the start of the turn-on operation.

The above configuration enables the delay output unit 4 to delay the correction output signal AO instructing the turn-on operation from the input signal IN in accordance with the length of the period for the transition change in the turn-off operation which is performed immediately before the turn-on operation. The above configuration also enables the delay output unit 4 to delay the correction output signal AO instructing the turn-off operation from the input signal IN in accordance with the length of the period for the transition change in the turn-on operation which is performed immediately before the turn-off operation. Outputting the pre-drive signal VPD by using the correction output signal AO as delayed in such manners enables correction of the delay time in each of the turn-on and turn-off operation.

Configurations other than the aforementioned configuration are almost the same as the configurations described in the first preferred embodiment. Accordingly, the same components or corresponding components will be denoted by the same reference signs, and description of these components will not be repeated.

According to the second preferred embodiment, when the IGBT 101 (FIG. 1) repeating the turn-on and turn-off operations alternately is driven, in accordance with a variation in a period for a transition change in the turn-off operation, the delay time in the immediately following turn-on operation is corrected. Further, in accordance with the variation the period for the transition change in this turn-on operation, the delay time in the immediately following turn-off operation is corrected. Consequently, correction is made in accordance with the variations in the periods for the transition changes in the turn-off and turn-on operations without the need for complex analysis of the transition changes and complicated adjustments in accordance with the result of the analysis. This enables a deviation in the width of the output signal of the IGBT 101 from the width of the input signal IN, which is caused by the variations in the periods for the transition changes, to be accurately corrected with a relatively simple configuration.

The second preferred embodiment describes that the delay output unit 4 stores the length of the period for the transition change in the immediately preceding turn-on operation and that the internal output unit 6 stores the length of the period for the transition change in the immediately preceding turn-off operation. In a non-limiting modification, the delay output unit 4 may store the length of the period for the transition change in the immediately preceding turn-off operation and the internal output unit 6 may store the length of the period for the transition change in the immediately preceding turn-on operation.

(Example of Implementation)

Figure 5:
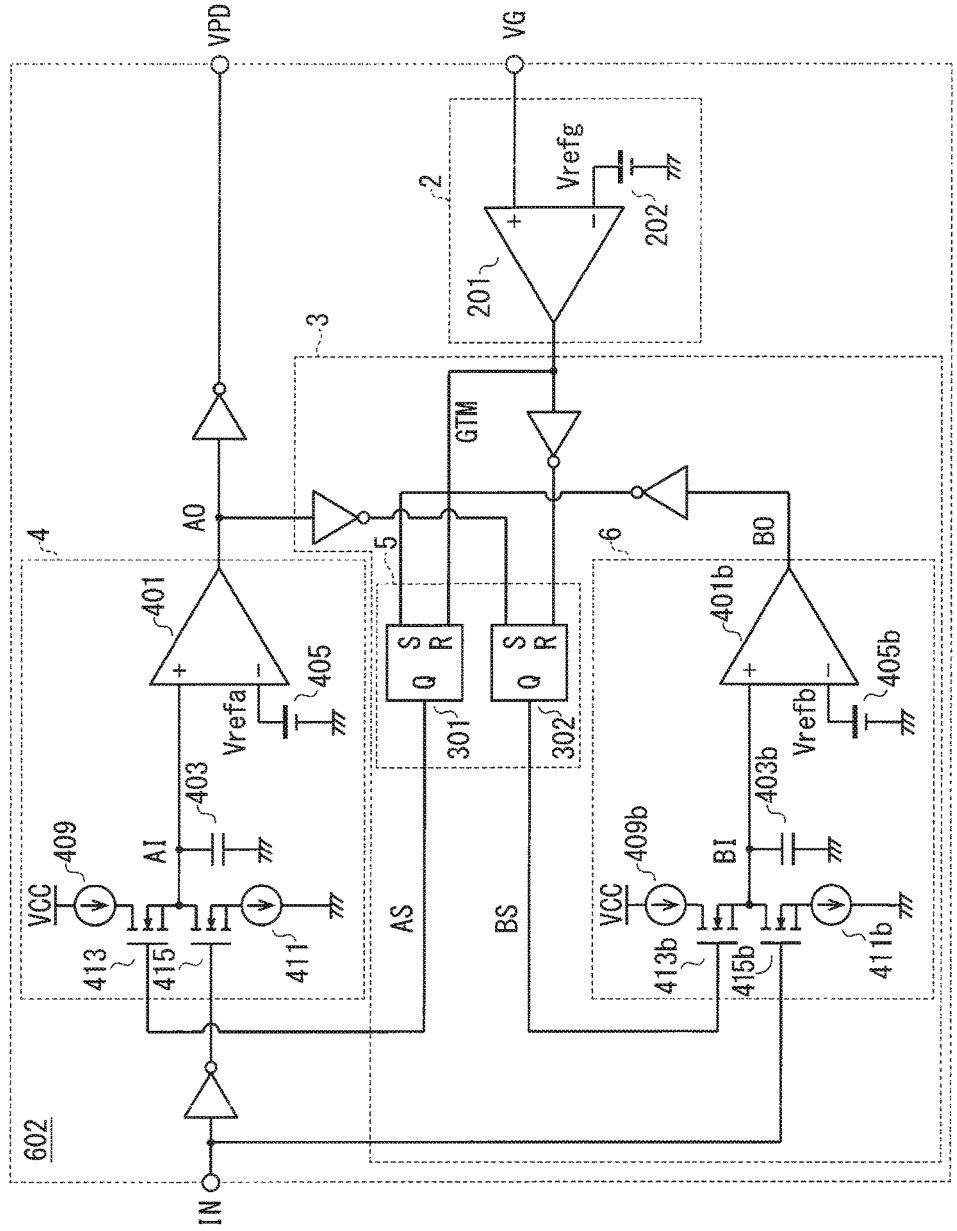
FIG. 5 is a circuit diagram illustrating a non-limiting example of how the delay-time correction circuit in FIG. 4 is implemented.
Figure 6:
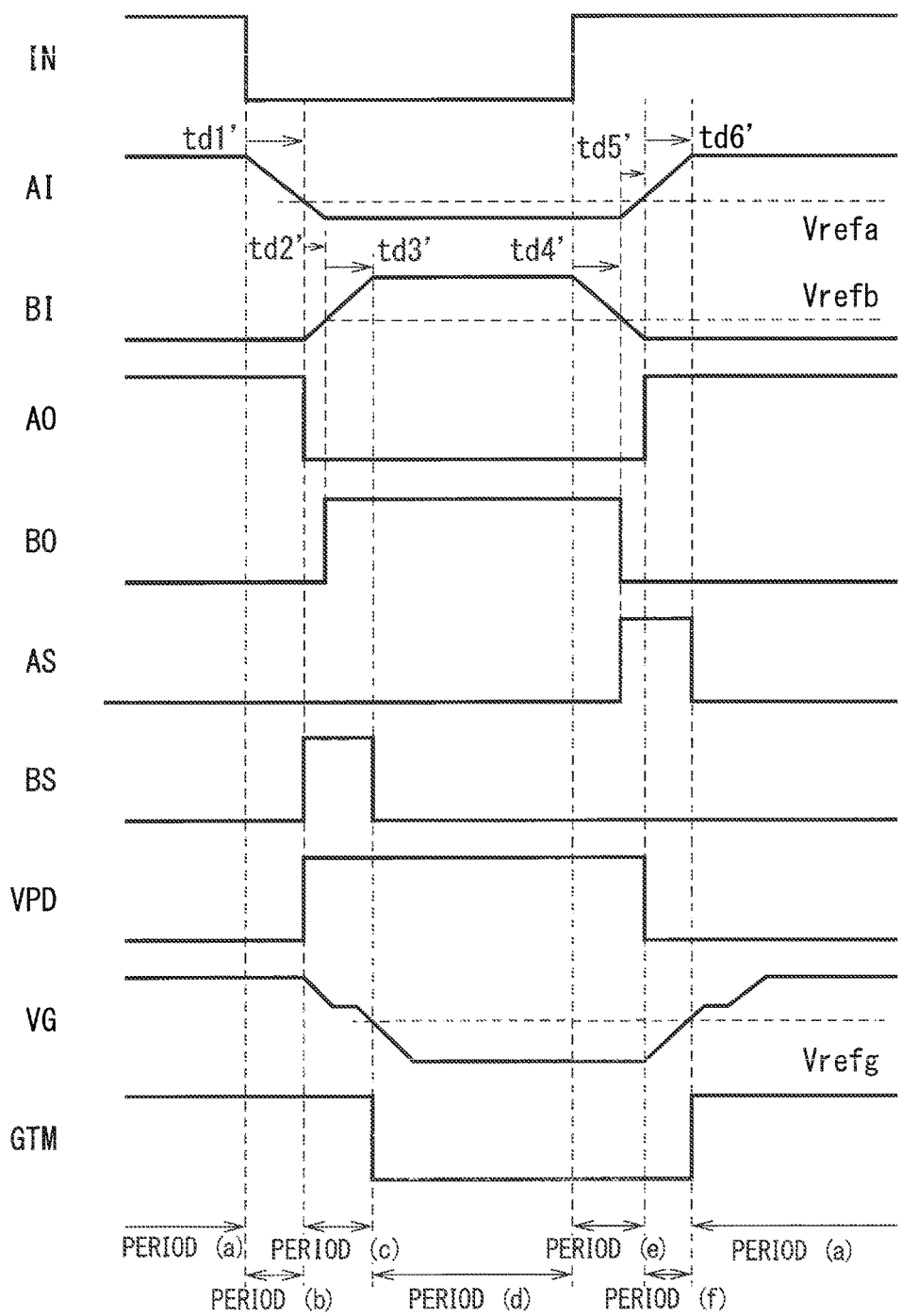
FIG. 6 is a time chart illustrating the operation of the semiconductor device in FIG. 5.

FIG. 5 is a circuit diagram illustrating a non-limiting example of how the aforementioned delay-time correction circuit 602 is implemented. FIG. 6 is a time chart illustrating the operation of the delay-time correction circuit 602.

The correction-signal controller 5 includes a latch circuit 301 and a latch circuit 302. Here, each of the latch circuits 301 and 302 is a set-reset flip-flop (SR-FF). In FIG. 5, "R", "S", and "Q" respectively denote a reset (R) signal, a set (S) signal, and an output (Q) signal.

The delay output unit 4 includes a circuit that is the same as the circuit (FIG. 2) in the first preferred embodiment. The internal output unit 6 may include a circuit configuration that is almost similar to the delay output unit 4 (FIG. 2). Specifically, the internal output unit 6 includes a capacitance 413*b*, a constant current source 409*b*, a constant current source 411*b*, an NMOS 413*b*, an NMOS 415*b*, a comparator 401*b*, and a constant voltage source 405*b*. These components in the internal output unit 6 respectively correspond to the capacitance 413, the constant current source 409, the constant current source 411, the NMOS 413, the NMOS 415, the comparator 401, and the constant voltage source 405, in the delay output unit 4. The constant voltage source 405*b* generates a predetermined voltage, Vrefb. A voltage of the capacitance 413*b* is defined as a terminal voltage, BI. In the present example, the voltage Vrefg is commonly used as a threshold in determining the completion of the transition changes in the individual turn-on and turn-off operations.

The latch circuit 301 receives, as the S signal, an inverted signal of the correction output signal BO from the internal output unit 6. The latch circuit 301 also receives, as the R signal, the transition-change sensing signal GTM. As a result of this structure, when the gate voltage VG is greater than the predetermined voltage Vrefg, the correction signal AS is at the low level in a manner independent of the correction output signal BO. The gate voltage VG can be smaller than the predetermined voltage Vrefg. In this case, the correction signal AS is at the high level when the correction output signal BO is at a low level, and the correction signal AS is at the low level when the correction output signal BO is at a high level. The gate voltage VG is smaller than the predetermined voltage Vrefg at the rising edge of the input signal IN. Thus, when the terminal voltage BI falls below the predetermined voltage Vrefb, the correction output signal BO changes to the low level, and thus the correction signal AS changes to the high level. Then, when the gate voltage VG exceeds the predetermined voltage Vrefg, the correction signal AS changes to the low level.

The latch circuit 302 receives, as the S signal, an inverted signal of the correction output signal AO from the delay output unit 4. The latch circuit 302 also receives, as the R signal, an inverted signal of the transition-change sensing signal GTM. As a result of this structure, when the gate voltage VG is smaller than the predetermined voltage Vrefg, the correction signal BS is at a low level in a manner independent of the correction output signal AO. The gate voltage VG can be greater than the predetermined voltage Vrefg. In this case, the correction signal BS is at a high level when the correction output signal AO is at a low level, and the correction signal BS is at the low level when the correction output signal AO is at a high level. The gate voltage VG is greater than the predetermined voltage Vrefg at the falling edge of the input signal IN. Thus, when the terminal voltage AI falls below the predetermined voltage Vrefa, the correction output signal AO changes to the low level, and thus the correction signal BS changes to the high level. Then, when the gate voltage VG falls below the predetermined voltage Vrefg, the correction signal BS changes to the low level.

The delay output unit 4 receives the correction signal AS to perform an operation for correcting the delay time during the turn-off operation. Specifically, the capacitance 403 is charged in accordance with the correction signal AS during the turn-on operation, and the capacitance 403 is discharged during the immediately following turn-off operation. The turn-off instruction based on the change in the input signal IN is prevented from being reflected to the change in the correction output signal AO until the terminal voltage AI of the capacitance 403 during the discharge falls below the predetermined voltage Vrefa. Consequently, the change, corresponding to the turn-off operation, in the pre-drive signal VPD, or the inverted signal of the correction output signal AO, is delayed by a time corresponding to the delay during the turn-on operation. Thus, the correction output signal AO is corrected in accordance with a deviation of the delay during the turn-on operation. Thus, the delay time during the turn-off operation is corrected in accordance with the deviation of the delay during the turn-on operation.

The internal output unit 6 receives the correction signal BS to perform an operation for correcting the delay time during the turn-on operation. Specifically, the capacitance 403b is charged during the turn-off operation in accordance with the correction signal BS, and the capacitance 403b is discharged during the immediately following turn-on operation. The turn-on instruction based on the change in the input signal IN is prevented from being reflected to the change in the correction output signal BO until the terminal voltage BI of the capacitance 403b during the discharge falls below the predetermined voltage Vrefb. Consequently, the change, corresponding to the turn-on operation, in the correction signal AS is delayed by a time corresponding to the delay during the turn-off operation. Thus, the capacitance 403 starts to be charged after a delay corresponding to the delay during the turn-off operation. Thus, timing when the terminal voltage AI of the capacitance 403 exceeds the predetermined voltage Vrefa is delayed by a time corresponding to the delay during the turn-off operation. Thus, the change, corresponding to the turn-on operation, in the pre-drive signal VPD, or the inverted signal of the correction output signal AO, is delayed by the time corresponding to the delay during the turn-off operation. Consequently, the correction output signal AO is corrected in accordance with a deviation of the delay during the turn-off operation. Thus, the delay time during the turn-on operation is corrected in accordance with the deviation of the delay during the turn-off operation.

The following describes the operation of the delay-time correction circuit 602 (FIG. 5) in line with a time chart (FIG. 6). The following periods (a) through (f) are repeated sequentially while the delay-time correction circuit 602 operates.

The period (a) is a period during which the input signal IN is at a high level and the gate voltage VG is a the high level, i.e., a period in the steady turn-on state. Since the gate voltage VG is at the high level, the correction signal AS is at the low level. Hence, the NMOS 413 is in the turn-off state. Further, since the inverted signal of the input signal IN is at the low level, the NMOS 415 is also in the turn-off state. Consequently, the terminal voltage AI of the capacitance 403 is maintained at the value to which the capacitance 403 has been charged during the immediately preceding turn-on operation. Thus, the inverted signal of the correction output signal AO is at a low level. Thus, the correction signal BS is at the low level. Thus, the NMOS 413b is in the turn-off state. Further, since the input signal IN is at the high level, the NMOS 415b is in the turn-on state. Thus, the capacitance 403b remains discharged by the constant current source 411b. In other words, the terminal voltage BI of the capacitance 403b is maintained at zero.

The period (b) is a period from when the input signal IN falls until the terminal voltage AI reaches the predetermined voltage Vrefa, i.e., a period lasting for a time td1'. The NMOS 415 is turned on in synchronization with the fall of the input signal IN. Consequently, the capacitance 403 starts to be discharged. As a result, the terminal voltage AI of the capacitance 403 starts falling and eventually reaches the predetermined voltage Vrefa. The NMOS 415b is turned off in synchronization with the fall of the input signal IN.

The period (c) is a period from when the terminal voltage AI falls below the predetermined voltage Vrefa until the gate voltage VG falls below the predetermined voltage Vrefg. When the terminal voltage AI falls below the predetermined voltage Vrefa, the correction output signal AO from the comparator 401 changes to the low level. Consequently, the pre-drive signal VPD changes to the high level, and the correction signal BS changes to the high level. As a result of the pre-drive signal VPD being at the high level, the gate voltage VG from the drive unit 500 (FIG. 2) starts falling. As a result of the correction signal BS being at the high level, the NMOS 413b is turned on. Thus, the capacitance 403b starts to be charged. As a result, the terminal voltage BI of the capacitance 403b starts rising and eventually reaches the predetermined voltage Vrefb. The former half of the period (c) is provided until this point. A time required for the former half is defined as a time td2'. Then, when the gate voltage VG falls below the predetermined voltage Vrefg, the transition-change sensing signal GTM changes to a low level. Consequently, the inverted signal of the transition-change sensing signal GTM changes to a high level, and thus the correction signal BS changes to the low level. Consequently, the NMOS 413b is turned off, and thus the capacitance 403b stops being charged. The latter half of the period (c) is provided until this point. A time required for the latter half is defined as a time td3'.

The period (d) is a period during which the input signal IN is at a low level and the gate voltage VG is at a low level, i.e., a period for the steady turn-off state. In the period (d), the terminal voltage BI is maintained at the voltage to which the capacitance 403b has been charged during the period (c). Further, the terminal voltage AI remains discharged.

The period (e) is a period from when the input signal IN rises until the terminal voltage AI reaches the predetermined voltage Vrefa. In synchronization with the rise of the input signal IN, the NMOS 415 is turned off and the NMOS 415b is turned on. As a result of the NMOS 415b being turned on, the capacitance 403b starts to be discharged. As a result, the terminal voltage BI of the capacitance 403b starts falling and eventually reaches the predetermined voltage Vrefb. The former half of the period (e) is provided until this point. A time required for the former half is defined as a time td4'. When the terminal voltage BI falls below the predetermined voltage Vrefb, the inverted signal of the correction output signal BO from the comparator 401b changes to a high level. Consequently, the correction signal AS changes to the high level. Thus, the NMOS 413 is turned on. Thus, the capacitance 403 starts to be charged. As a result, the terminal voltage AI of the capacitance 403 starts to rise and eventually reaches the predetermined voltage Vrefa. The latter half of the period (e) is provided until this point. A time required for the latter half is defined as a time td5'.

The period (f) is a period from when the terminal voltage AI exceeds the predetermined voltage Vrefa until the gate voltage VG exceeds the predetermined the voltage Vrefg, i.e., a period lasting for a time td6'. When the terminal voltage AI exceeds the predetermined voltage Vrefa, the correction output signal AO from the comparator 401 changes to the high level. Consequently, the pre-drive signal VPD changes to the low level. Thus, the gate voltage VG from the drive unit 500 (FIG. 2) starts rising. When the gate voltage VG exceeds the predetermined the voltage Vrefg, the transition-change sensing signal GTM changes to the high level. Consequently, the correction signal AS changes to the low level. Thus, the NMOS 413 is turned off Thus, the capacitance 403 stops being charged.

A lapse of the period (f) again provides the state where the input single IN is at the high level and the gate voltage VG is at the high level, i.e., the steady turn-on state. In other words, the period (a) starts again. As such, the periods (a) through (f) are repeated.

The delay time during the turn-on operation is a total time of the periods (e) and (f), i.e., td4'+td5'+td6'. The delay time during the turn-off operation is a total time of the periods (b) and (c). i.e., td1'+td2'+td3'. Setting a speed of the charge of the capacitance 403b to be equal to a speed of the discharge of the capacitance 403b equalizes the times td3' and td4'. Further, setting the speed of the charge of the capacitance 403b to be equal to the speed of the discharge of the capacitance 403b approximately equalizes the times td1' and td6'. Here, as illustrated in FIG. 6, the terminal voltage AI normally takes the same maximum voltage periodically. In this case, the time td1' is equal to the time td6'. Thus, a difference between the delay time during the turn-on operation and the delay time during the turn-off operation is a difference between the time td2' and the time td5'. Accordingly, equalizing the times td2' and td5' provides a correction to equalize the delay time during the turn-on operation and the delay time in turn-off operation. To equalize the time td2' and the time td5', a charge time for the capacitance 403b required for the terminal voltage BI to reach the predetermined voltage Vrefb is desirably the same as a charge time for the capacitance 403 required for the terminal voltage AI to reach the predetermined voltage Vrefa. To achieve this, the capacities 403 and 403b are desirably equal to each other, and the constant current sources 409 and 409b are desirably equal to each other, for instance.

Third Preferred Embodiment

Figure 7:
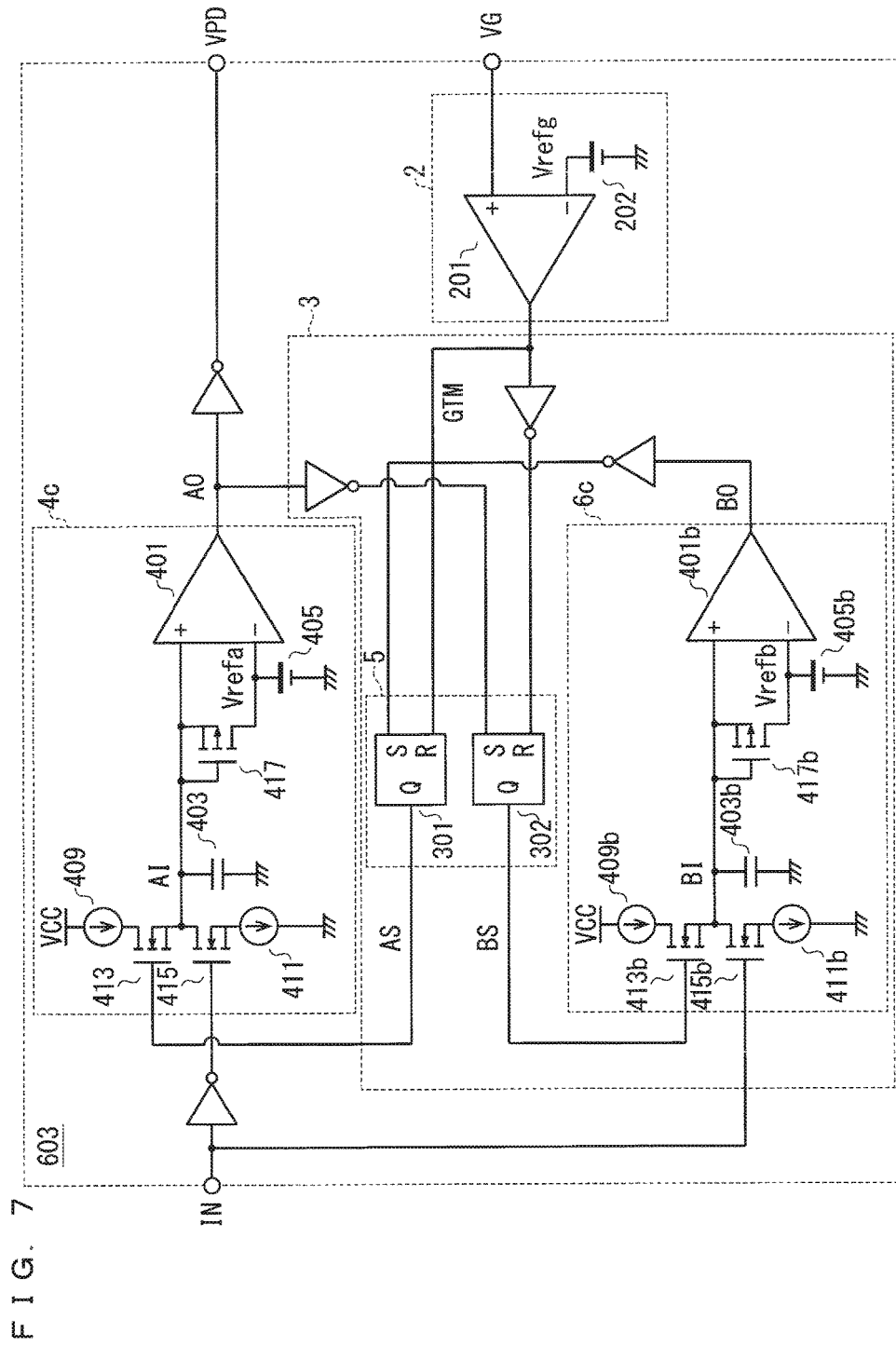
FIG. 7 is a circuit diagram illustrating a non-limiting example of how a delay-time correction circuit included in a semiconductor device according to a third preferred embodiment of the present invention is implemented.

FIG. 7 is a circuit diagram illustrating a non-limiting example of how a delay-time correction circuit 603 in a third preferred embodiment is implemented. In the third preferred embodiment, the delay-time correction circuit 603 includes a delay output unit 4c and an internal output unit 6c in place of the delay output unit 4 and internal output unit 6 in the delay-time correction circuit 602 (FIG. 5), respectively. The delay output unit 4c includes a clamp circuit incorporated into the delay output unit 4. The internal output unit 6c includes a clamp circuit incorporated into the internal output unit 6. The following described a specific configuration.

The delay output unit 4c includes a clamp circuit 417 at a positive input terminal of the comparator 401. The internal output unit 6c includes a clamp circuit 417b at a positive input terminal of the comparator 401b. The clamp circuits 417 and 417b respectively clamps the terminal voltages AI and BI during the discharge at a predetermined clamping voltage. The clamp circuit 417 is set to have a smaller clamping voltage than the predetermined voltage Vrefa, and is set so that a delay until the terminal voltage AI rises during the charge of the capacitance to exceed the predetermined voltage Vrefa becomes shorter. Accordingly, a lower limit of a voltage of the capacitance 403 is clamped at a value between the predetermined voltage Vrefa and a voltage of zero. In other words, the lower limit of the voltage of the capacitance 403 is greater than the voltage zero and smaller than the predetermined voltage Vrefa. Specifically, this lower limit is desirably set to be slightly smaller than the predetermined voltage Vrefa, as not to cause a malfunction. Likewise, the clamp circuit 417b is set to have a smaller clamping voltage than the predetermined voltage Vrefb, and is set so that a delay until the terminal voltage BI rises during the charge of the capacitance to exceed the predetermined voltage Vrefb becomes shorter.

Configurations other than the aforementioned configuration are almost the same as the configurations described in the second preferred embodiment. Accordingly, the same components or corresponding components will be denoted by the same reference signs, and description of these components will not be repeated.

According to the third preferred embodiment, the terminal voltages AI and BI during the discharge are clamped. Such a configuration shortens delays until the terminal voltages AI and BI rise during the charge of the capacities to exceed the predetermined voltages Vrefa and Vrefb. That is, this configuration shortens the time td2', which is required for the terminal voltage BI to rise from its lower limit to the predetermined voltage Vrefb, during the period (c) in FIG. 6. Such a configuration also shortens the time td5', which is required for the terminal voltage AI to rise from its lower limit to the predetermined voltage Vrefa, during the period (e) in FIG. 6. As a result, a total sum of the delay times in the turn-on and turn-off operations is shortened. Further, a difference between these delay times is minimized.

Fourth Preferred Embodiment

Figure 8:
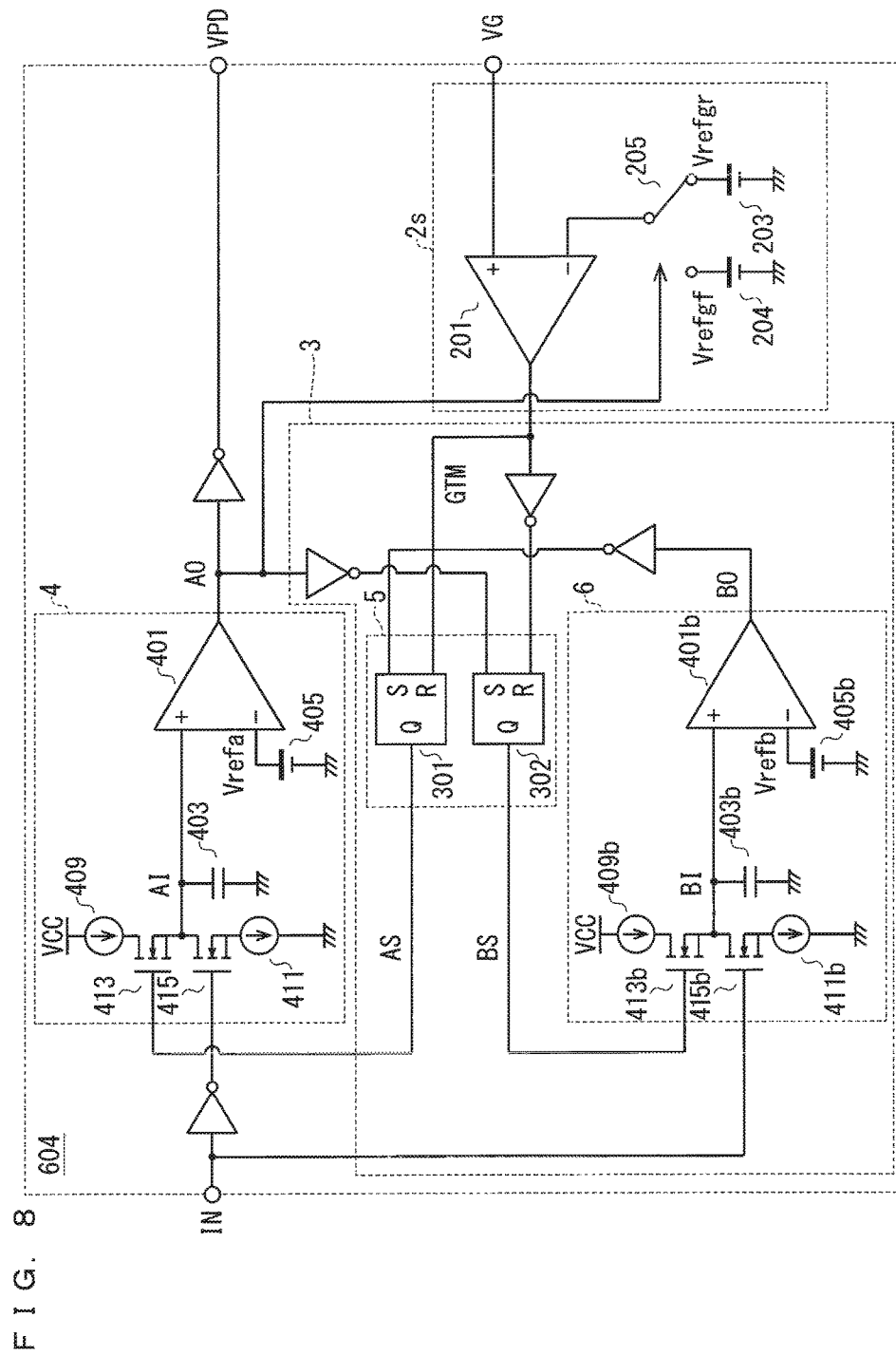
FIG. 8 is a circuit diagram illustrating a non-limiting example of how a delay-time correction circuit included in a semiconductor device according to a fourth preferred embodiment of the present invention is implemented.

FIG. 8 is a circuit diagram illustrating a non-limiting example of how a delay-time correction circuit 604 in a fourth preferred embodiment is implemented. In the fourth preferred embodiment, the delay-time correction circuit 604 includes a transition-change sensor 2s in place of the transition-change sensor 2 (FIG. 5).

Like the transition-change sensor 2, the transition-change sensor 2s senses the transition changes by comparing a measurement value of the IGBT 101 (FIG. 2) and a measurement threshold. However, the transition-change sensor 2s uses different values as the measurement threshold in accordance with whether a to-be-sensed transition change belongs to the turn-on operation or the turn-off operation. For this purpose, the transition-change sensor 2s includes a constant voltage source 203, a constant voltage source 204, and a switch 205. The constant voltage sources 203 and 204 are an alternative to the constant voltage source 202 of the transition-change sensor 2. The switch 205 is used to select which of constant voltage sources 203 and 204 is used.

The constant voltage source 203 and the constant voltage source 204 respectively generate a predetermined voltage Vrefgr and a predetermined voltage Vrefgf. The predetermined voltage Vrefgr is used as a threshold in referring to the gate voltage VG to determine the completion of the turn-on operation. The voltage Vrefgf is used as a threshold in referring to the gate voltage VG to determine the completion of the transition change in the turn-off operation. Thus, the switch 205 is controlled so that the constant voltage source 203 is used during the turn-on operation, and that the constant voltage source 204 is used during the turn-off operation. For this control, the switch 205 may refer to the correction output signal AO. Specifically, the switch 205 connects a negative input terminal of the comparator 201 to the constant voltage source 203 when the correction output signal AO is at the high level; and to the constant voltage source 204 when the correction output signal AO is at the low level.

Configurations other than the aforementioned configuration are almost the same as the configurations described in the second preferred embodiment. Accordingly, the same components or corresponding components will be denoted by the same reference signs, and description of these components will not be repeated.

According to the fourth preferred embodiment, the thresholds, which are used to refer the gate voltage VG to thus determine the completion of the transition changes, are individually set for the turn-on operation and the turn-off operation. This enables a more accurate correction of the delay times. For instance, the predetermined voltage Vrefgf during the turn-off operation is set to be relatively higher. This minimizes an influence of a tail voltage during the turn-off operation.

Fifth Preferred Embodiment

According to the aforementioned preferred embodiments 1 to 4, the deviation in the width of the output signal of the IGBT 101 from the width of the input signal IN, which is caused by the variations in the period for the transition change of the IGBT 101 (FIG. 1), is corrected for each switching operation. The delay time of the pre-drive signal. VPD with respect to the input signal IN can be varied along with this correction. That is, while accuracy of signal widths is secured, the delay time of the pre-drive signal VPD as a whole can be varied. That is, while the waveform of the input signal IN is accurately reflected to the waveform of the pre-drive signal VPD, a phase difference between the input signal IN and the pre-drive signal VPD can be varied. Such variations may not be allowed in some uses. Accordingly, provided in a fifth preferred embodiment is a configuration for keeping a delay time until the change in the input signal IN is transmitted as the pre-drive signal VPD constant.

Figure 9:
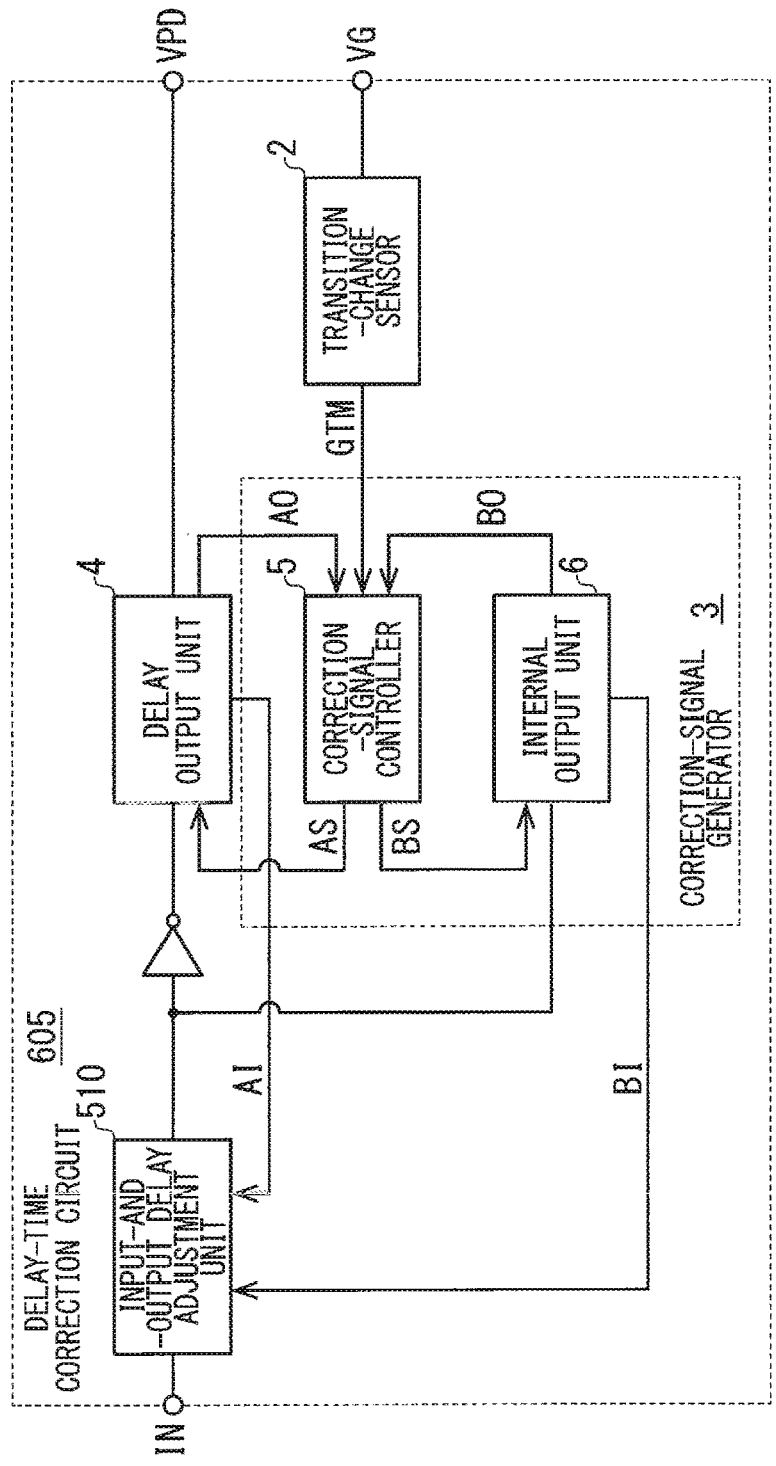
FIG. 9 is a schematic block diagram of a configuration of a delay-time correction circuit included in a semiconductor device according to a fifth preferred embodiment of the present invention.

FIG. 9 is a schematic block diagram of a configuration of a delay-time correction circuit 605 in the fifth preferred embodiment. The delay-time correction circuit 605 includes an input-and-output delay adjustment unit 510 in addition to the configuration of the delay-time correction circuit 602 (FIG. 4: the second preferred embodiment). In the fifth preferred embodiment, the input signal IN is adjusted by the input-and-output delay adjustment unit 510 before being used. In this adjustment, the periods of the high and low levels in the input signal IN are not corrected for each pulse; rather, a simple delay corresponding to a time as set is given to the input signal IN. Changing this set time adjusts the delay time of the pre-drive signal VPD with respect to the input signal IN.

The input-and-output delay adjustment unit 510 adjusts a delay of the output signal from the input signal IN in accordance with a time that is delayed by the delay output unit 4. The adjustment of the delay time can be made through, for instance, monitoring at least one of the terminal voltages AI and BI (FIG. 6). By monitoring the terminal voltage AI, the input-and-output delay adjustment unit 510 can recognize a delay time (time td1') that is required for the change in the input signal IN to the low level to be transmitted to the change in the pre-drive signal VPD to the high level. Further, by monitoring the terminal voltage BI, the input-and-output delay adjustment unit 510 can recognize a delay time (time td4'+td5') that is required for the change in the input signal IN to the high level to be transmitted to the change in the pre-drive signal VPD to the low level. The input-and-output delay adjustment unit 510 gives a delay to the input signal IN, to reduce a difference between the delay time recognized as described above and a desirable delay time. This enables the delay times to be approximately constant.

Sixth Preferred Embodiment

An IC into which one of the aforementioned delay-time correction circuits 601 to 605 is integrated may require a certain protective operation. For instance, such a protective operation is required at the rise of a power supply voltage or in case of an abnormal drop of the power supply voltage. Lack of an appropriate protective operation may cause a malfunction. For instance, reference is made to the delay-time correction circuit 602 (FIG. 5). At the rise of the power supply voltage, an input of the NMOS 413b and an input of the NMOS 415b are at low levels when the input signal IN is at the low level. Thus, a terminal for the terminal voltage BI has a high impedance. Thus, the terminal voltage BI is variable, and thus the malfunction can occur. A similar situation can apply to a terminal for the terminal voltage AI. To address this possible occurrence of the malfunction, the terminal voltage AI and the terminal voltage BI are each preferably returned to a predetermined initial state by the protective operation. The sixth preferred embodiment provides a configuration for this initialization.

Figure 10:
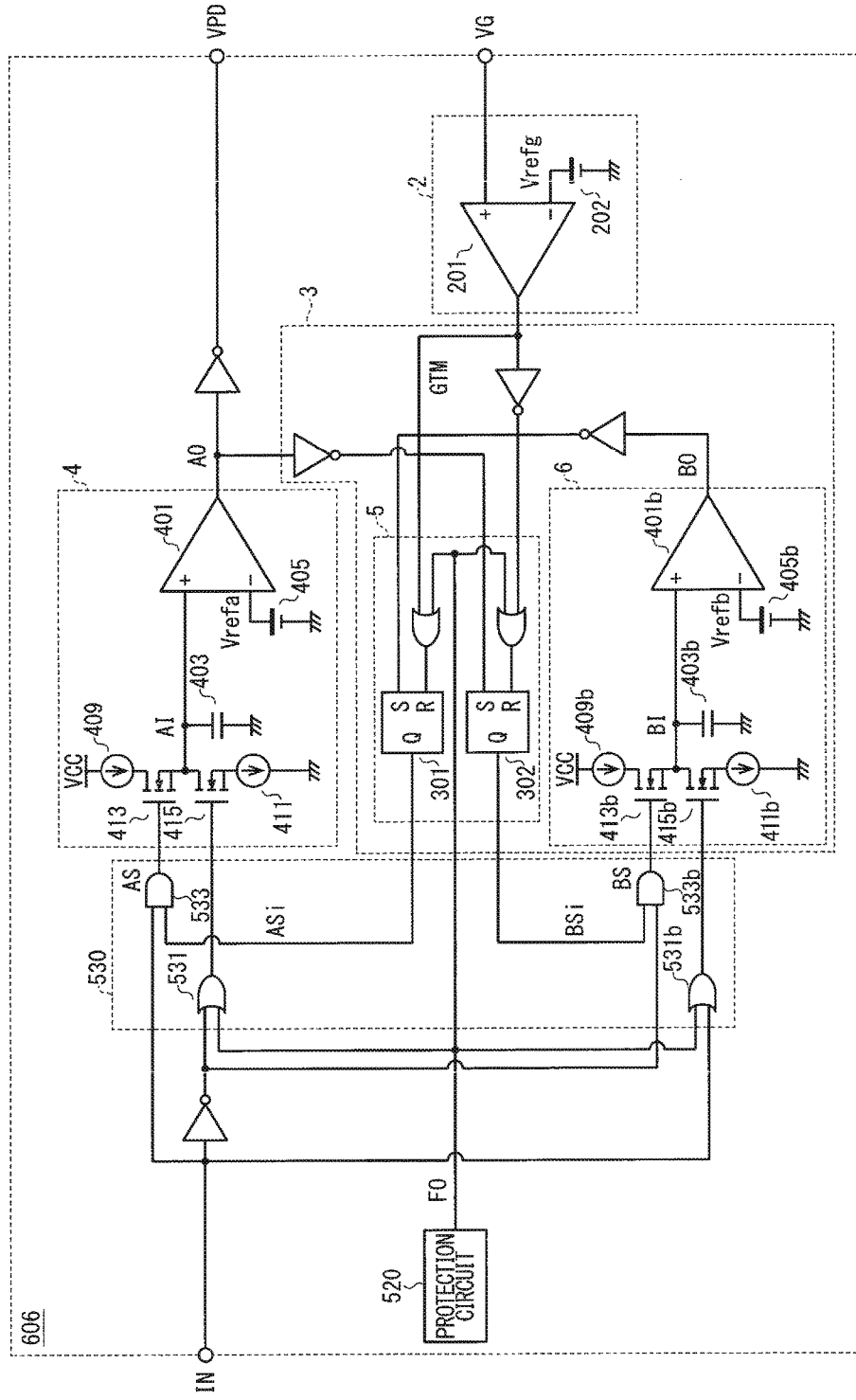
FIG. 10 is a circuit diagram illustrating a non-limiting example of how a delay-time correction circuit included in a semiconductor device according to a sixth preferred embodiment of the present invention is implemented.

FIG. 10 is a circuit diagram illustrating a non-limiting example of how a delay-time correction circuit 606 in the sixth preferred embodiment is implemented. The delay-time correction circuit 606 includes a protection circuit 520 and an initialization circuit 530, in addition to the configuration of the delay-time correction circuit 602 (FIG. 4: the second preferred embodiment).

The protection circuit 520 protects an IC of the delay-time correction circuit 606 and is preferably disposed within the IC. The protection circuit 520 generates a protection signal FO during its protective operation. Specifically, the protection signal FO is at a high level during a predetermined period. Non-limiting examples of the protection circuit 520 include a protection circuit for power-supply-voltage rise and a protection circuit for power-supply-voltage drop.

As earlier mentioned, the correction-signal generator 3 generates the correction signal AS during the turn-on operation and generates the correction signal BS during the turn-off operation. Further, in the sixth preferred embodiment, the correction signals AS and BS are made to be at the low levels while the protection signal FO is at the high level. For this purpose, the protection signal FO is input to individual R-signal terminals of the latch circuits 301 and 302 included in the correction-signal controller 5.

The initialization circuit 530 receives the protection signal FO and generates a signal for placing the delay output unit 4 and the internal output unit 6 into predetermined initial states. An OR circuit 531 and An OR circuit 531b each output a logical sum of the input signal IN or its inverted signal and the protection signal FO, to gates of the NMOS 415 and NMOS 415b. Accordingly, the NMOS 415 and NMOS 415b are turned on while the protection signal FO is at the high level. Consequently, the terminal voltage AI and the terminal voltage BI are in predetermined states and are particularly at the low levels in this example. In one modification, a similar configuration may be applied to the delay-time correction circuit 603. In such a case, the terminal voltage AI and the terminal voltage BI are clamped at predetermined voltages.

The above configuration enables the protection circuit 520 to perform the protective operation in which the voltage of the capacitance 403 is set to be a predetermined voltage.

Unlike the delay-time correction circuit 601 to 605, the delay-time correction circuit 606 does not use a correction signal ASi without being processed as the correction signal AS, where the correction signal ASi is output from the latch circuit 301 of the correction-signal controller 5. Rather, the delay-time correction circuit 606 uses a logical product of the correction signal. ASi and the input signal IN. An AND circuit 533 is provided for this purpose. Thus, the correction signal AS is at the high level only while the input signal IN is at the high level and while the correction signal ASi is at a high level. Further, the delay-time correction circuit 606 does not use a correction signal BSi without being processed as the correction signal BS, either, where the correction signal BSi is output from the latch circuit 302 of the correction-signal controller 5. Rather, the delay-time correction circuit 606 uses a logical product of the correction signal BSi and the inverted signal of the input signal IN. An AND circuit 533b is provided for this purpose. The correction signal BS is at the high level only while the input signal IN is at the low level and while the correction signal BSi is at a high level.

Providing the AND circuit 533 prevents the short-circuit which occurs if the NMOS 413 and the NMOS 415 are simultaneously turned on after the delay-time correction circuit 606 is in the initial state as a result of the protective operation. The following details the short-circuit and the prevention of the same.

Preferably, the terminal voltage AI and the terminal voltage BI are respectively in predetermined initial states lower than the predetermined voltage Vrefa and the predetermined voltage Vrefb, where such initial states are set as a result of the protective operation. In this case, the correction output signal BO is at the low level. Hence, if the transition-change sensing signal GTM is at the low level immediately after the protective operation is canceled, i.e., immediately after the protection signal FO changes to the low level, the correction signal ASi is at the high level. If this correction signal ASi without being processed is input to the gate of the NMOS 413, the NMOS 413 is turned on. At this point, if the input signal IN is at the low level, the NMOS 415 is also in the turn-on state, which causes the short-circuit. According to the sixth preferred embodiment, the correction signal AS, which input to the gate of the NMOS 413, is the logical product of the correction signal ASi and the input signal IN. Hence, when the input signal IN is at the low level, the correction signal AS is at the low level. Consequently, the above short-circuit is prevented. Likewise, the AND circuit 533b prevents the short-circuit which occurs if the NMOS 413b and the NMOS 415b are simultaneously turned on.

In particular, the protection circuit 520 can be the protection circuit for power-supply-voltage drop. In such a case, the protection circuit 520 performs the protective operation when the power supply voltage VCC falls below a power-supply-voltage threshold, where the power supply voltage VCC is supplied to the delay-time correction circuit 606. In this case, a maximum value of the terminal voltage AI is preferably set to be lower than the power-supply-voltage threshold, where such a maximum value is obtained as a result of the charge of the capacitance 403. If the power supply voltage VCC falls below the terminal voltage AI, a current may flow through an unexpected path, such as a parasitic element, to thus cause a malfunction, such as latchup. Accordingly, the terminal voltage AI is set to have a charge voltage lower than a threshold for power-supply-voltage-drop protection. This provides the initialization by the protective operation before the power supply voltage VCC becomes lower than the terminal voltage AI. Consequently, the above malfunction is prevented. For the same reason, the terminal voltage BI is preferably set to have a maximum value lower than the power-supply-voltage threshold.

Seventh Preferred Embodiment

FIG. 11 is a schematic block diagram of a configuration of an inverter 907 (semiconductor device) in a seventh preferred embodiment. The inverter 907 includes an IGBT 101m, an IGBT 101n (both are semiconductor switching elements), and a semiconductor-device drive circuit 807. The IGBTs 101m and 101n are connected in parallel with each other. The semiconductor-device drive circuit 807 is used to drive these IGBTs.

The semiconductor-device drive circuit 807 separately generates a gate signal VGm for the IGBT 101m and a gate signal VGn for the IGBT 101n, in response to the input signal IN, which is commonly used. The semiconductor-device drive circuit 807 includes a drive circuit unit 800m and a drive circuit unit 800n. The drive circuit units 800m and 800n each have a configuration similar to that of the semiconductor-device drive circuit 801 (FIG. 1). It is to be noted that one of the delay-time correction circuits 602 to 606 may be used in place of the delay-time correction circuit 601 included in the semiconductor-device drive circuit 801.

A path to the drive circuit unit 800m for the input signal IN and a path to the drive circuit unit 800n for the input signal IN may be mutually short-circuited. Consequently, the input signal IN can be supplied from a single terminal of the semiconductor-device drive circuit 807 to both drive circuit unit 800m and drive circuit unit 800n.

The drive circuit unit 800*m* and the drive circuit unit 800*n* are separately connected to the IGBT 101*m* and the IGBT 101*n*. Consequently, the gate signal VG generated by the drive circuit unit 800*m* is output to the IGBT 101*m* as a gate signal VGm. Further, the gate signal VG generated by the drive circuit unit 800*n* is output to the IGBT 101*n* as a gate signal VGn.

According to the seventh preferred embodiment, a deviation of a delay time of the gate signal VGm and a deviation of a delay time of the gate signal VGn are separately corrected. Thus, if there is a difference between a transition change of the IGBT 101*m* and a transition change of the IGBT 101*n*, an accurate correction would be achieved.

The seventh preferred embodiment describes a configuration in which the two IGBTs 101*m* and 101*n* are used as the semiconductor switching elements that are connected in parallel with each other. However, any number of semiconductor switching elements may be connected in parallel with each other. The number of drive circuit units may be determined in conformance with the number of semiconductor switching elements.

It is to be noted that in the present invention, respective preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A delay-time correction circuit configured to delay an input signal that is externally input for generating a pre-drive signal to a drive unit generating a drive signal for a semiconductor switching element, said delay-time correction circuit comprising:
    a transition-change sensor configured to sense a transition change in one of a turn-on operation and turn-off operation of said semiconductor switching element;
    a correction-signal generator configured to generate a correction signal in response to said transition change sensed by said transition-change sensor and to said input signal; and
    a delay output unit configured to generate an output signal corresponding to said pre-drive signal by delaying said input signal using said correction signal,
    wherein said delay output unit is configured to delay said output signal that instructs the other of a turn-on operation and turn-off operation, from said input signal, in accordance with a length of a period for said transition change in the one of a turn-on operation and turn-off operation that is performed immediately before the other of a turn-on operation and turn-off operation.

2. The delay-time correction circuit according to claim 1, wherein said transition-change sensor is configured to sense said transition change of said semiconductor switching element in response to a change in a gate voltage that is applied to said semiconductor switching element.

3. The delay-time correction circuit according to claim 1, wherein said transition-change sensor is configured to sense said transition change of said semiconductor switching element in response to a change in a voltage between main terminals of said semiconductor switching element.

4. The delay-time correction circuit according to claim 1, wherein said transition-change sensor is configured to sense said transition change of said semiconductor switching element in response to a change in a current between main terminals of said semiconductor switching element.

5. The delay-time correction circuit according to claim 1, wherein the one of a turn-on operation and turn-off operation is a turn-on operation.

6. The delay-time correction circuit according to claim 1, wherein the one of a turn-on operation and turn-off operation is a turn-off operation.

7. The delay-time correction circuit according to claim 1,
    wherein said transition-change sensor is further configured to sense a transition change in the other of a turn-on operation and turn-off operation of said semiconductor switching element, and
    wherein said delay output unit is configured to delay said output signal that instructs the one of a turn-on operation and turn-off operation, from said input signal, in accordance with a length of a period for said transition change in the other of a turn-on operation and turn-off operation that is performed immediately before the one of a turn-on operation and turn-off operation.

8. The delay-time correction circuit according to claim 1,
    wherein said delay output unit comprises a capacitance that is charged in accordance with said period for said transition change of said semiconductor switching element, and is configured to determine said output signal by comparing a voltage value of said capacitance and a predetermined capacitance voltage threshold, and
    wherein a lower limit of said voltage value of said capacitance is clamped at a value between said predetermined capacitance voltage threshold and a voltage of zero.

9. The delay-ti circuit according to claim 1,
    wherein said transition-change sensor is configured to sense said transition change of said semiconductor switching element by comparing a measurement value of said semiconductor switching element and a measurement threshold, and
    wherein said transition-change sensor uses different values as said measurement threshold in accordance with whether a to-be-sensed transition change belongs to a turn-on operation or a turn-off operation.

10. A semiconductor-device drive circuit comprising:
    said delay-time correction circuit according to claim 1; and
    said drive unit.

11. The semiconductor-device drive circuit according to claim 10, further comprising an input-and-output delay adjustment unit configured to adjust a delay of said output signal from said input signal in accordance with a time delayed by said delay output unit.

12. The semiconductor-device drive circuit according to claim 10,
    wherein said delay output unit comprises a capacitance that is charged in accordance with said period for said transition change of said semiconductor switching element, and
    wherein semiconductor-device drive circuit further comprises a protection circuit that is capable of performing a protective operation in which a voltage of said capacitance is set to be a predetermined voltage.

13. The semiconductor-device drive circuit according to claim 12,
    wherein said protection circuit is configured to perform said protective operation when a power supply voltage that is supplied to said delay-time correction circuit falls below a power-supply-voltage threshold, and wherein a maximum voltage that is obtained as a result of charge of said capacitance of said delay output unit is set to be lower than said power-supply-voltage threshold.

14. A semiconductor device comprising:
said semiconductor-device drive circuit according to claim 10; and
said semiconductor switching element.

15. The semiconductor device according to claim 14, wherein said semiconductor switching element comprises a portion made of silicon carbide.

16. A semiconductor-device drive circuit configured to drive a plurality of semiconductor switching elements that are connected in parallel with each other,
said semiconductor-device drive circuit comprising a plurality of drive circuit units that are separately connected to said plurality of semiconductor switching elements, each of said plurality of drive circuit units comprising
a drive unit configured to generate a drive signal, and
a delay-time correction circuit configured to delay an input signal that is externally input for generating a pre-drive signal to said drive unit, said delay-time correction circuit comprising
a transition-change sensor configured to sense a transition change in one of a turn-on operation and turn-off operation of each of said plurality of semiconductor switching elements,
a correction-signal generator configured to generate a correction signal in response to said transition change sensed by said transition-change sensor and to said input signal, and
a delay output unit configured to generate an output signal corresponding to said pre-drive signal by delaying said input signal using said correction signal,
wherein said delay output unit is configured to delay said output signal that instructs the other of a turn-on operation and turn-off operation, from said input signal, in accordance with a length of a period for said transition change in the one of a turn-on operation and turn-off operation that is performed immediately before the other of a turn-on operation and turn-off operation.

* * * * *